(12) United States Patent
Hartman et al.

(10) Patent No.: US 10,723,395 B2
(45) Date of Patent: Jul. 28, 2020

(54) SPLIT CHASSIS SYSTEM

(71) Applicant: Dell Products L.P., Round Rock, TX (US)

(72) Inventors: Corey Dean Hartman, Hutto, TX (US); Yu-Feng Lin, Taipei (TW)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/438,114

(22) Filed: Jun. 11, 2019

(65) Prior Publication Data

US 2019/0291792 A1    Sep. 26, 2019

Related U.S. Application Data

(63) Continuation of application No. 15/650,641, filed on Jul. 14, 2017, now Pat. No. 10,363,978.

(51) Int. Cl.
| | |
|---|---|
| *G06F 1/16* | (2006.01) |
| *H05K 5/00* | (2006.01) |
| *H05K 7/00* | (2006.01) |
| *B62D 53/06* | (2006.01) |
| *B60P 1/64* | (2006.01) |
| *B62D 21/14* | (2006.01) |
| *B60P 1/04* | (2006.01) |
| *G06F 1/18* | (2006.01) |
| *H05K 7/14* | (2006.01) |

(52) U.S. Cl.
CPC ............ *B62D 53/067* (2013.01); *B60P 1/045* (2013.01); *B60P 1/6481* (2013.01); *B62D 21/14* (2013.01); *G06F 1/183* (2013.01); *H05K 7/1487* (2013.01)

(58) Field of Classification Search
CPC .. H05K 7/1485; H05K 7/1488; H05K 7/1489; H05K 7/18; H05K 7/183; H05K 7/186; H05K 7/1401; H05K 7/14; H05K 7/00; H05K 5/00; H05K 5/02; H05K 5/0204; H05K 5/0217; G06F 1/18; G06F 1/181; G06F 1/183
USPC ................................................ 361/724–727
See application file for complete search history.

(56) References Cited

U.S. PATENT DOCUMENTS

| | | | | |
|---|---|---|---|---|
| 5,571,256 | A | * | 11/1996 | Good ....................... H02B 1/36 211/151 |
| 6,183,053 | B1 | * | 2/2001 | Foslien .................... H05K 7/18 312/223.2 |

(Continued)

*Primary Examiner* — Anthony M Haughton
(74) *Attorney, Agent, or Firm* — Haynes and Boone, LLP

(57) ABSTRACT

A split chassis system includes a first chassis base portion that is configured to house a first component and a second chassis base portion that is configured to house a second component. The second chassis base portion is positioned adjacent the first chassis base portion such that a first chassis coupling member included on the first chassis base portion is coupled to a second chassis coupling member included on the second chassis base portion. The split chassis system further includes a leveling subsystem that is coupled to the first chassis base portion and the second chassis base portion. The leveling subsystem aligns the first chassis base portion and the second chassis base portion such that the first chassis base portion and the second chassis base portion substantially maintain coplanarity when the first chassis coupling member is coupled to the second chassis coupling member.

20 Claims, 16 Drawing Sheets

(56) References Cited

U.S. PATENT DOCUMENTS

| | | | | |
|---|---|---|---|---|
| 6,220,456 B1* | 4/2001 | Jensen | ............... | G06F 1/16 |
| | | | | 211/189 |
| 6,360,900 B1* | 3/2002 | Carbonneau | ........... | H05K 7/183 |
| | | | | 211/26 |
| 6,622,366 B2* | 9/2003 | Luffel | ................. | H05K 7/1421 |
| | | | | 211/59.2 |
| 6,909,611 B2* | 6/2005 | Smith | ................... | G06F 1/181 |
| | | | | 307/43 |
| 9,326,414 B2* | 4/2016 | Eberle, Jr. | ............ | H05K 7/1489 |
| 2003/0006682 A1* | 1/2003 | Hoffman | ................ | A47B 88/40 |
| | | | | 312/334.1 |
| 2007/0070612 A1* | 3/2007 | Coutancier | .......... | H05K 7/1489 |
| | | | | 361/797 |
| 2012/0114272 A1* | 5/2012 | Hays | ................... | H05K 7/1489 |
| | | | | 384/19 |
| 2017/0251560 A1* | 8/2017 | Spencer | ................ | G06F 1/181 |

\* cited by examiner

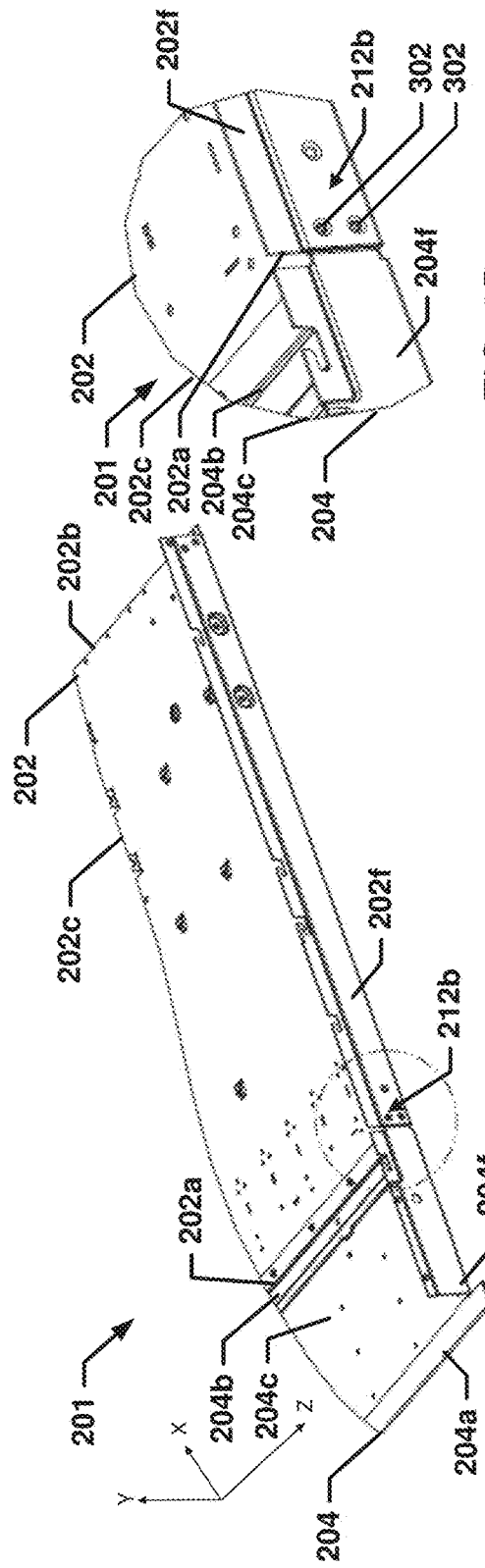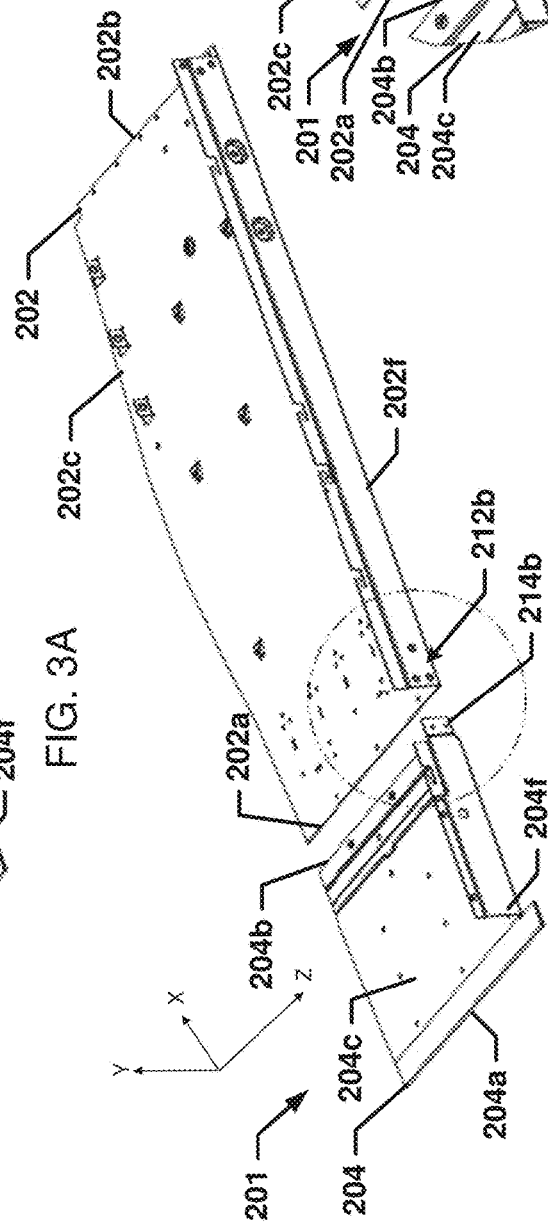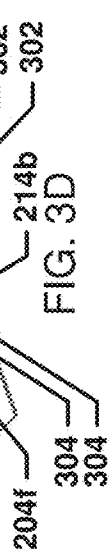

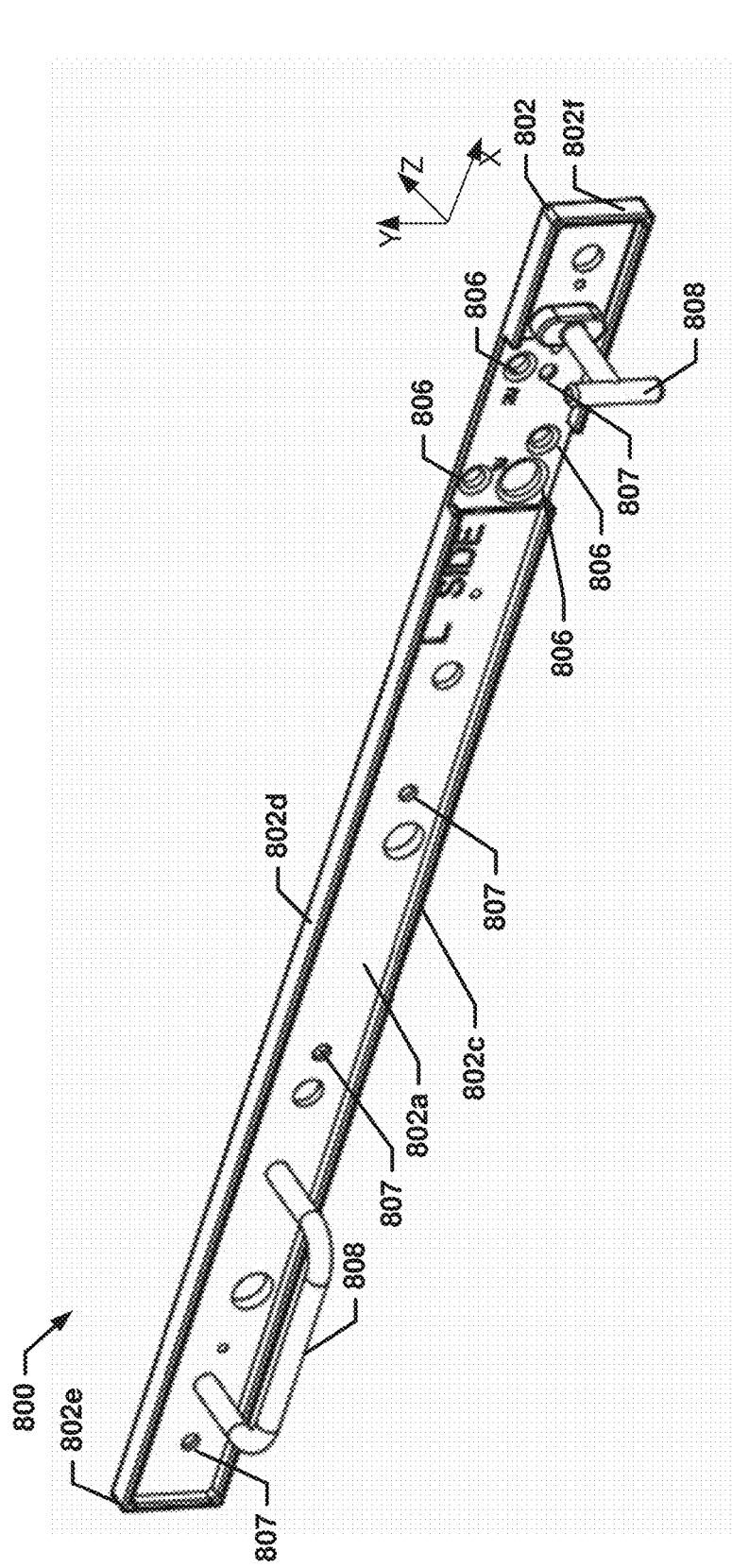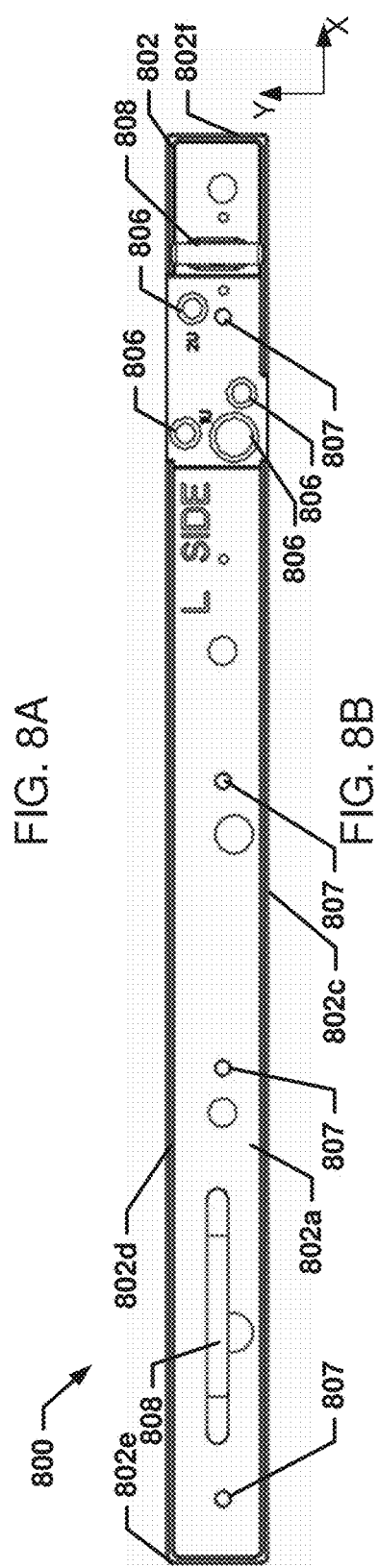
FIG. 8A
FIG. 8B

900

```
┌─────────────────────────────────────────────┐
│ POSITION A FIRST CHASSIS BASE PORTION       │
│ ADJACENT A SECOND CHASSIS BASE PORTION      │
│                    902                      │
└─────────────────────────────────────────────┘
                      ↓
┌─────────────────────────────────────────────┐
│ ALIGN, VIA A LEVELING SUBSYSTEM INCLUDED    │
│ ON THE FIRST CHASSIS BASE PORTION AND THE   │
│ SECOND CHASSIS BASE PORTION, THE FIRST      │
│ CHASSIS BASE PORTION AND THE SECOND         │
│ CHASSIS BASE PORTION TO BE COPLANAR         │
│                    904                      │
└─────────────────────────────────────────────┘
                      ↓
┌─────────────────────────────────────────────┐
│ COUPLE, VIA A FIRST COUPLING MEMBER         │
│ LOCATED ON THE FIRST CHASSIS BASE PORTION   │
│ AND A SECOND COUPLING MEMBER LOCATED ON     │
│ THE SECOND CHASSIS BASE PORTION, THE FIRST  │
│ CHASSIS BASE PORTION TO THE SECOND          │
│ CHASSIS BASE PORTION                        │
│                    906                      │
└─────────────────────────────────────────────┘
```

FIG. 9

SPLIT CHASSIS SYSTEM

CROSS-REFERENCE TO RELATED APPLICATIONS

This is a Continuation application to U.S. Utility application Ser. No. 15/650,641 filed Jul. 14, 2017, entitled "SPLIT CHASSIS SYSTEM,", the disclosure of which is incorporated herein by reference in its entirety.

BACKGROUND

The present disclosure relates generally to information handling systems, and more particularly to a split chassis system for modular information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Oftentimes, information handling systems (IHSs) and other information handling resources (e.g., storage devices, input/output devices, and other peripheral devices) are manufactured with modular form factors and may be configured to be disposed in a chassis. Such a chassis and its modular IHS components and resources typically include various rails, carriers, and other mechanical components that allow the addition and removal of the modular IHS components and resources to and from the chassis. For example, storage subsystem may be typically fastened to the chassis in a factory environment. As such, building or servicing the chassis with storage subsystems generally requires assembling or removing modules, assembling or removing fasteners that attach modules to the chassis. The duration of such activity may disrupt the availability of the IHS provided in the chassis, and create a maintenance burden in servicing the storage devices or other modular components included in the chassis.

Accordingly, it would be desirable to provide an improved chassis system for modular IHS components.

SUMMARY

According to one embodiment, an information handling system (IHS), includes a first IHS component; a second IHS component coupled to the first IHS component; and a split chassis system, that includes a first chassis base portion that is configured to house the first component and that includes a first chassis front face, a first chassis rear face that is opposite the first chassis base portion from the first chassis front face, and at least one first chassis wall extending between the first chassis front face and the first chassis rear face, wherein the at least one first chassis wall includes a first chassis coupling member; a second chassis base portion that is configured to house the second component and that includes a second chassis front face, a second chassis rear face that is opposite the second chassis base portion from the second chassis front face, and at least one second chassis wall extending between the second chassis front face and the second chassis rear face, wherein the at least one second chassis wall includes a second chassis coupling member, and wherein the second chassis rear face is positioned adjacent the first chassis front face such that the first chassis coupling member is coupled to the second chassis coupling member; and a leveling subsystem that is coupled to the first chassis base portion and the second chassis base portion, wherein the leveling subsystem aligns the first chassis base portion and the second chassis base portion such that the first chassis base portion and the second chassis base portion substantially maintain coplanarity when the first chassis coupling member is coupled to the second chassis coupling member.

BRIEF DESCRIPTION OF THE DRAWINGS

FIG. 3A is a partial, isometric view illustrating an embodiment of a split chassis system used with the modular system of FIG. 2.

FIG. 3B is an exploded, isometric view illustrating an embodiment of coupling members on the split chassis system of FIG. 3A.

FIG. 3C is a partial, isometric view illustrating an embodiment of a first chassis base portion uncoupled from a second chassis base portion on the split chassis system of FIG. 3A.

FIG. 3D is an exploded, isometric view illustrating an embodiment of the first chassis coupling member of the first chassis base portion and a second chassis coupling member of the second chassis base portion on the split chassis system of FIG. 3C.

FIG. 8A is an isometric front view illustrating an embodiment of a fixture member of a leveling subsystem used with the modular system of FIG. 2.

FIG. 8B is a front view illustrating an embodiment of the fixture member of FIG. 8A.

FIG. 9 is a flow chart illustrating an embodiment of a method for coupling a first chassis base portion to a second chassis base portion to provide a split chassis system.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
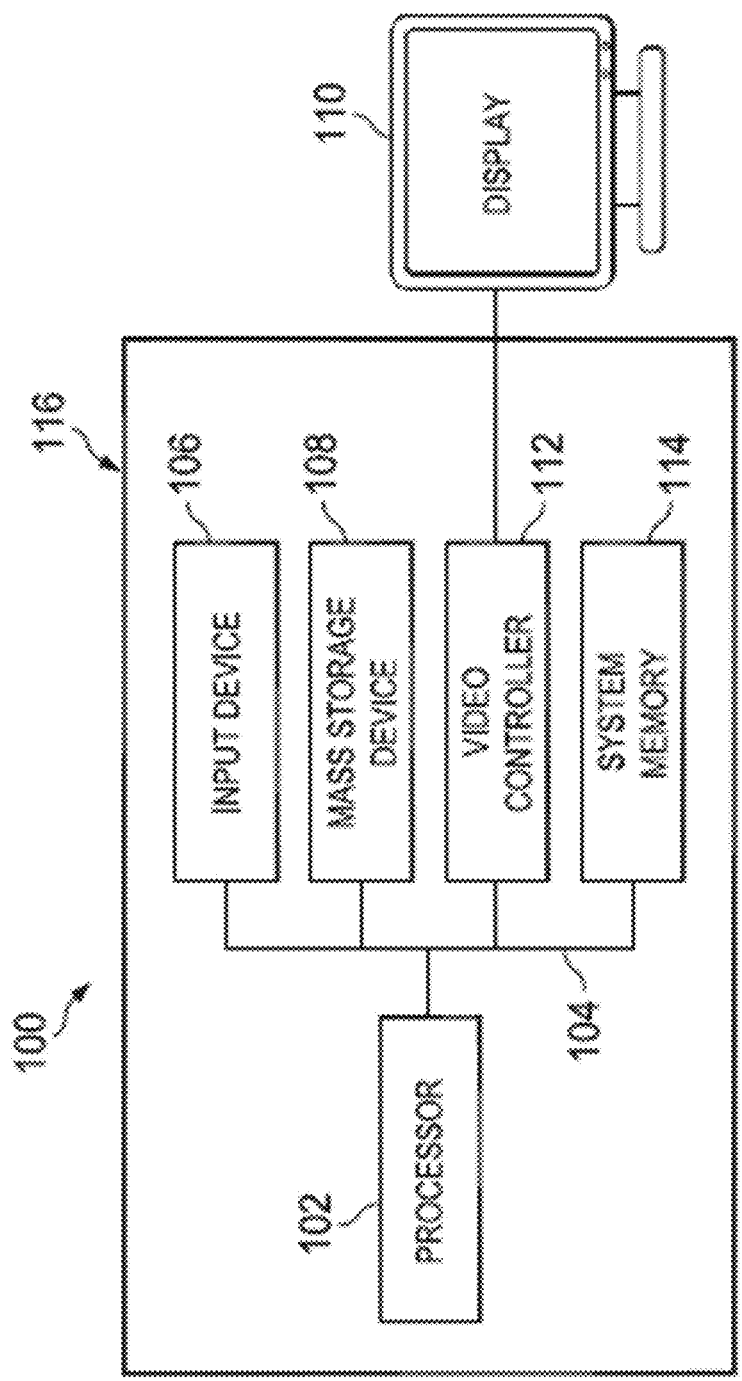
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
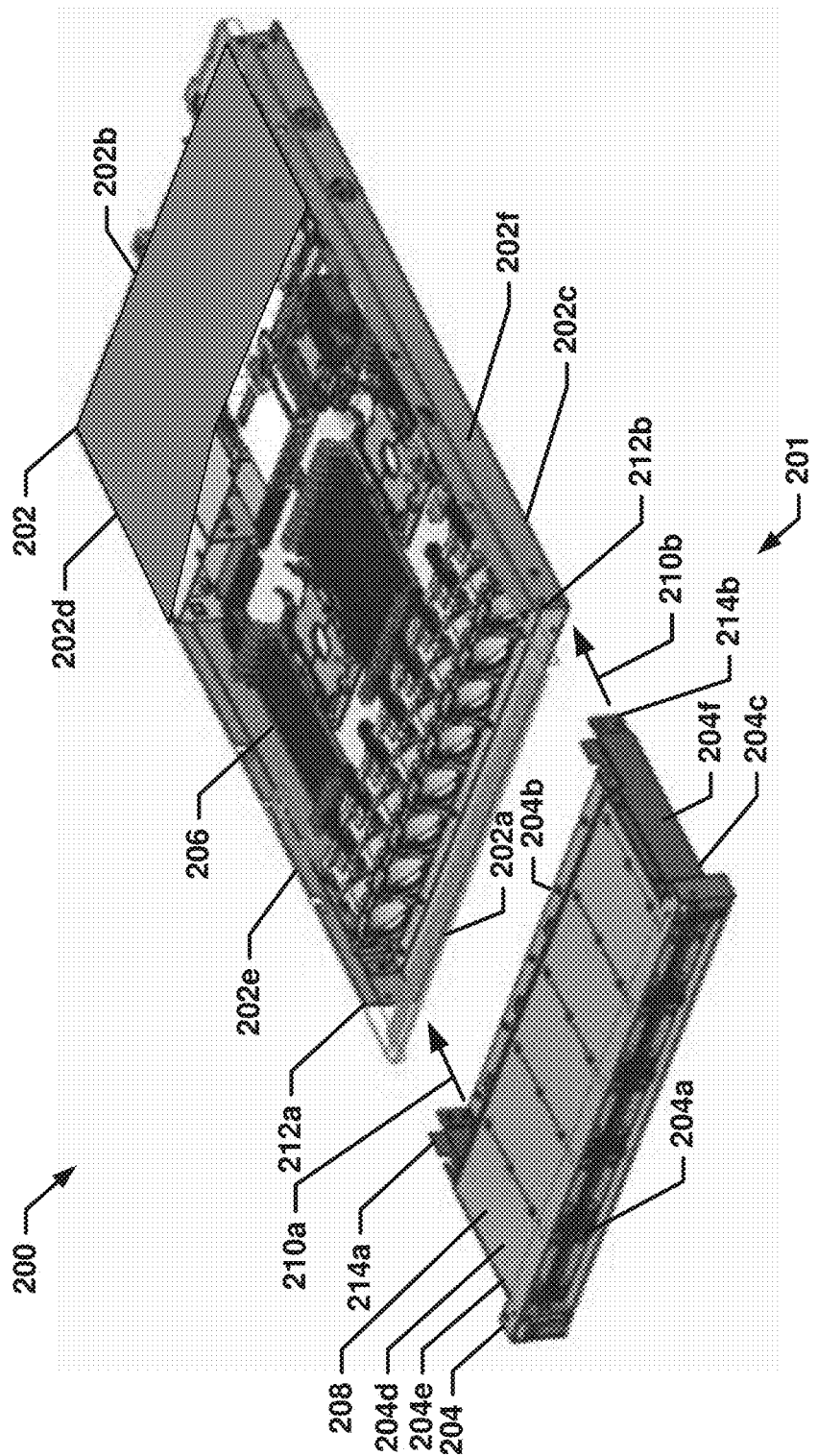
FIG. 2 is an isometric view illustrating an embodiment of a modular chassis system.

Referring now to FIG. 2, an embodiment of a modular system 200 is illustrated. In an embodiment, the modular system 200 may be the IHS 100 and/or include some or all of the IHS components of the IHS 100, described above with reference to FIG. 1. In a specific example, the modular system 200 may include a modular server housed in a split chassis system 201 that may be configured to be inserted into a rack chassis such as a server rack. The split chassis system 201 may include a first chassis base portion 202 and a second chassis base portion 204. The first chassis base portion 202 may include a first chassis front face 202a (or edge), a first chassis rear face 202b that is located opposite the first chassis base portion 202 from the first chassis front face 202a, and at least one wall extending between the first chassis front face 202a and the first chassis rear face 202b. For example, the first chassis base portion 202 may include a first chassis bottom wall 202c extending between the first chassis front face 202a and the first chassis rear face 202b, a first chassis top wall 202d (partially cutaway in FIG. 2) located opposite the first chassis base portion 202 from the first chassis bottom wall 202c and extending between the first chassis front face 202a and the first chassis rear face 202b, and a pair of first chassis side walls 202e and 202f that are located opposite each other on the first chassis base portion 202 and that each extend between the first chassis front face 202a, the first chassis rear face 202b, the first chassis bottom wall 202c, and the first chassis top wall 202d. One or more components, such as, for example, a first chassis component 206 may be located in the first chassis base portion 202. The first chassis component 206 may include a variety of electrical and/or mechanical components that may be housed in the first chassis base portion 202 such as, for example, a processor socket, a processor, memory devices, a memory slot for a memory card, a basic input output system (BIOS), various types of controllers, a heat sink, a video card, a video card slot, power connectors, a power supply, a network card, ports, a midplane, a backplane, and/or other components that would be apparent to one of skill in the art in possession of the present disclosure.

The second chassis base portion 204 may include a second chassis front face 204a, a second chassis rear face 204b (or edge) that is located opposite the second chassis base portion 204 from the second chassis front face 204a, and at least one wall extending between the second chassis front face 204a and the second chassis rear face 204b. For example, the second chassis base portion 204 may include a second chassis bottom wall 204c extending between the second chassis front face 204a and the second chassis rear face 204b, a second chassis top wall 204d (not illustrated in FIG. 2) located opposite the second chassis base portion 204 from the second chassis bottom wall 204c and extending between the second chassis front face 204a and the second chassis rear face 204b, and a pair of second chassis side walls 204e and 204f that are located opposite each other on the second chassis base portion 204 and that each extend between the second chassis front face 204a, the second chassis rear face 204b, the second chassis bottom wall 204c, and the second chassis top wall 204d. One or more components, such as, for example, a second chassis component 208, may be located in the second chassis base portion 204. The second chassis component 208 may include a variety of electrical and/or mechanical components that may be housed in the second chassis base portion such as, for example, a processor socket, a processor, memory devices, a memory slot for a memory card, a basic input output system (BIOS), various types of controllers, a heat sink, a video card, a video card slot, power connectors, a power supply, a network card, ports, a midplane, a backplane, and/or other components that would be apparent to one of skill in the art in possession of the present disclosure.

In an embodiment, as indicated by arrows 210a and 210b, the second chassis rear face 204b of the second chassis base portion 204 is positioned adjacent the first chassis front face 202a of the first chassis base portion 202 such that a first chassis coupling member included on at least one wall of the first chassis base portion 202 is located adjacent a second chassis coupling member included on at least one wall of the second chassis base portion 204, and coupling members utilize the first chassis coupling member(s) and second chassis coupling member(s) to couple the first chassis base portion 202 to the second chassis base portion 204. The coupling of the first chassis base portion 202 to the second chassis base portions 204 provides the split chassis system 201.

Referring now to FIGS. 3A, 3B, 3C, 3D, and 3E, an embodiment of the split chassis system 201 of FIG. 2 is illustrated. The split chassis system 201 may include the first chassis base portion 202 and the second chassis base portion 204 discussed above. In a specific example, the second chassis rear face 204b of the second chassis base portion 204 is positioned adjacent the first chassis front face 202a of the first chassis base portion 202 such that the first chassis coupling member 212b included on the first chassis side wall 202f is located adjacent the second chassis coupling member 214b included on the second chassis side wall 204f of the second chassis base portion 204, and coupling members utilize the first chassis coupling member 212b and second chassis coupling member 214b to couple the first chassis base portion 202 to the second chassis base portion 204. In that specific example, the first chassis coupling member 212b may include at least one aperture 302 that may extend through the first chassis side wall 202f. Similarly, the second chassis coupling member 214b may include at least one aperture 304 that may extend through the second chassis side wall 204f. When the second chassis rear face 204b of the second chassis base portion 204 is positioned adjacent the first chassis front face 202a of the first chassis base portion 202, the aperture 302 of the first chassis coupling member 212b may align with the aperture 304 of the second chassis coupling member 214b such that a pin, a bolt, a screw, and/or other fastener may be inserted into the aligned apertures 302 and 304 such that the first chassis base portion 202 is coupled to the second chassis base portion 204 to form the split chassis system 201. In various embodiments, one or more of the apertures 302 and 304 may be threaded to receive a screw. However, in other embodiments the apertures 302 and 304 may not be threaded but may be configured to receive a bolt or pin that may be configured receive a nut to secure the first chassis base portion 202 to the second chassis base portion 204. While specific coupling features have been described, one of skill in the art in possession of the present disclosure will recognize that a variety of coupling devices may be utilized to provide the split chassis system 201 while remaining within the scope of the present disclosure.

Figure 3E:
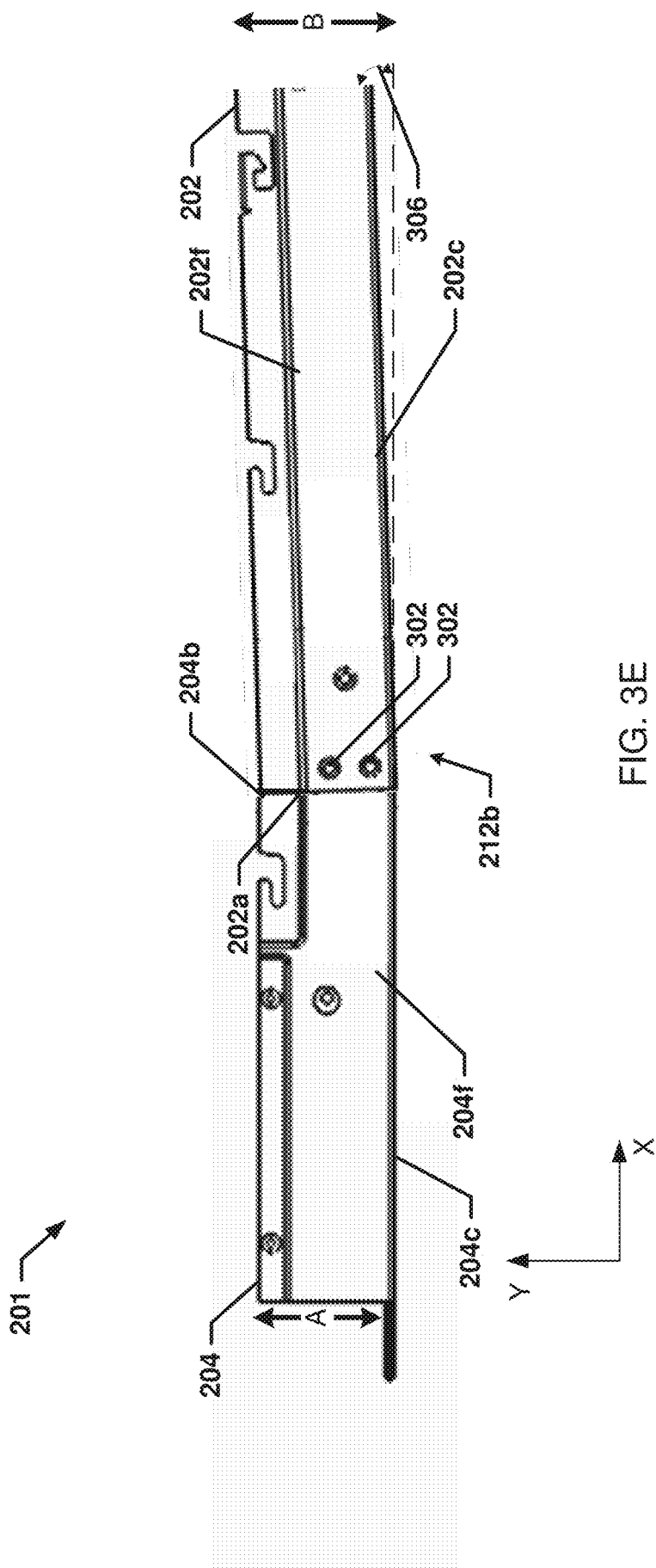
FIG. 3E is a side view illustrating an angular misalignment associated with the split chassis system of FIG. 3A.

Referring now to FIG. 3E, an embodiment of the split chassis system 201 in its coupled-together configuration is illustrated. FIG. 3E illustrates the first chassis base portion 202 coupled to the second chassis base portion 204 via fasteners to provide the split chassis system 201. As illustrated and discussed above, the first chassis coupling member 212b is coupled to the second chassis coupling member 214b by aligning apertures 302 and 304 and inserting a fastener into the aligned apertures 302 and 304 such that the second chassis base portion 204 is secured to the first chassis base portion 202 to provide the split chassis system 201. The split chassis system 201 may provide benefits over other modular information handling system chassis discussed above because the split chassis system 201 allows system design and supply chain flexibility in enabling different combinations of front and rear types of information handling subsystems, in which otherwise an entirely new unique chassis must be designed and managed. Thus, second or alternative configuration may be created with a second chassis base portion 204 being replaced with another second chassis base portion 204 with minimal interruption to the factory operations the first chassis base portion 202. Furthermore, components 208 included in the second chassis base portion 204 may be added, removed, or replaced without interruption to the factory or supply chain processes being performed and associated with the first chassis base portion 202.

However, as illustrated in FIG. 3E, using the techniques discussed above, manufacturing issues may occur in the split chassis system 201. In a specific example, when assembling a split chassis system 201, which may be 24"-29" in length (although one of skill in the art in possession of the present disclosure will recognize that other lengths experience similar issues), maintaining coplanarity between the first chassis base portion 202 and the second chassis base portion 204 during assembly is challenging. Specifically, the apertures 302 and 304 may experience variances when stamped or drilled into the side walls (e.g., side walls 202f and 204f). Thus, when the first chassis base portion 202 is coupled to the second chassis base portion 204, a nominal shift of the fastener due to gaps between the fastener and the edges of the apertures 302 and 304 may occur due to variations in work surfaces (i.e., uneven work surfaces), which may cause the first chassis base portion 202 and the second chassis base portion 204 to be positioned without coplanarity, but still within aperture clearances. Furthermore, user interaction with split chassis system 201 may shift the first chassis base portion 202 and/or the second chassis base portion 204 such that they are positioned without coplanarity, and bend tolerances on the side walls may create variability in the actual location of the apertures 302 and 304. Thus, as illustrated in FIG. 3E, the first chassis base portion 202 may be shifted by an angle 306 from the XZ-plane such that the first chassis base portion 202 and the second chassis base portion 204 are not coplanar in the XZ-plane. This shift in angle from the XZ-plane may be referred to as Z-axis angle variation. This angular misalignment may result in the split chassis system 201 having a size and/or coplanarity that is outside of a tolerance for the split chassis system 201 to be inserted into a rack chassis. For example, a height A may be the height of the split chassis system 201 that will fit in a rack chassis envelope, while a height B may be the actual height of the split chassis system 201 due to the lack of coplanarity of the first chassis base portion 202 and the second chassis base portion 204, which is greater than height A and results in the split chassis system 201 not being able to fit in the rack chassis envelope. The difference in height A and height B may be referred to as Y-direction variation herein. Thus, when embodiments of the present disclosure are describe as "maintaining substantial coplanarity" of the first chassis base portion 202 and the second chassis base portion 204, those embodiments may be considered to be providing the first chassis base portion 202 and the second chassis base portion 204 positioned within a tolerance of coplanarity that allows the split chassis system 201 to be inserted into a rack chassis envelope and maintain the desired functionality of the split chassis system 201. In a specific example, the Z-axis angle variation that is within a tolerance of coplanarity may be less than 1.5 degrees for a split chassis system 201 that is 26 inches long. However, shorter split chassis systems may have a greater tolerance in Z-axis angle variation while longer split chassis systems may have lessor tolerance in Z-axis angle variation because the effect the Z-axis angle variation has on Y-direction variation. Furthermore, the tolerance of coplanarity with respect to the Z-axis angle variation may depend on the rack chassis. For example, a 1U rack chassis envelope a split chassis system 201 may be designed to have a height of 1.7 inches. If the Y-direction variation is greater than 0.05 inches, the split chassis system 201 would be out of the tolerance of coplanarity. In addition, factors such as rail kit mounting tolerances, sag of the split chassis system under its own weight, and other factors apparent to one of skill in the art in possession of the present disclosure that affect fit of the split chassis system 201 in a rack chassis envelope may be considered when determining a tolerance of coplanarity for the split chassis system 201 while still remaining within the scope of the present disclosure.

Figure 4A:
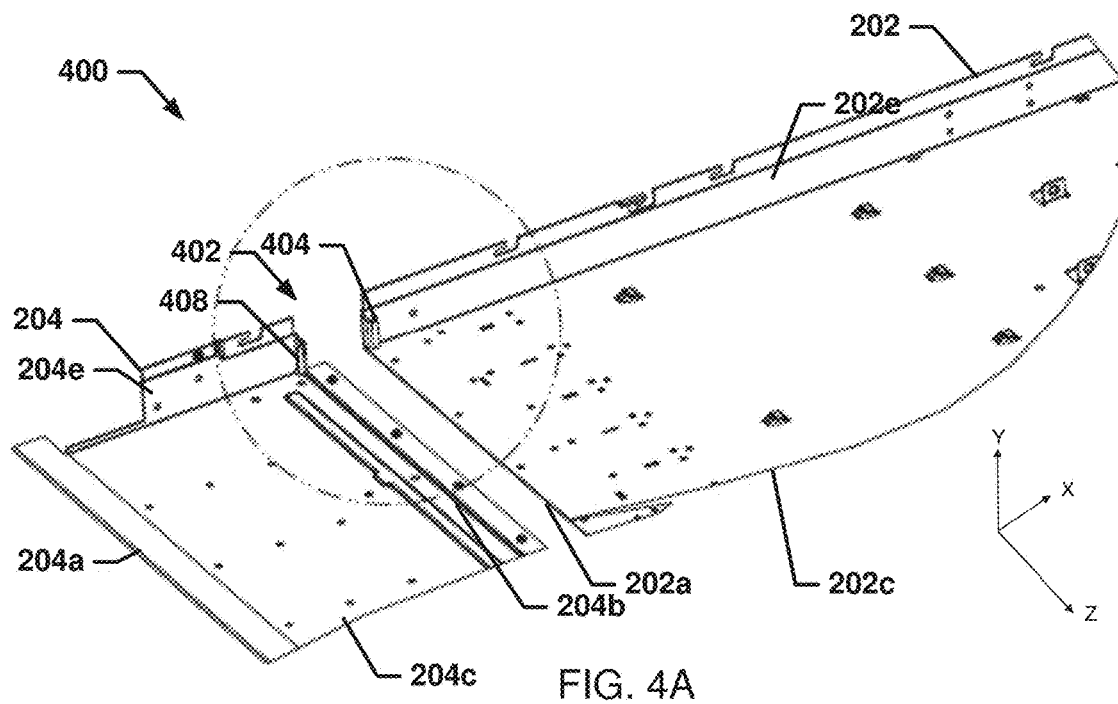
FIG. 4A is a partial, isometric view illustrating an embodiment of a split chassis system including a leveling subsystem used with the modular system of FIG. 2.
Figure 4B:
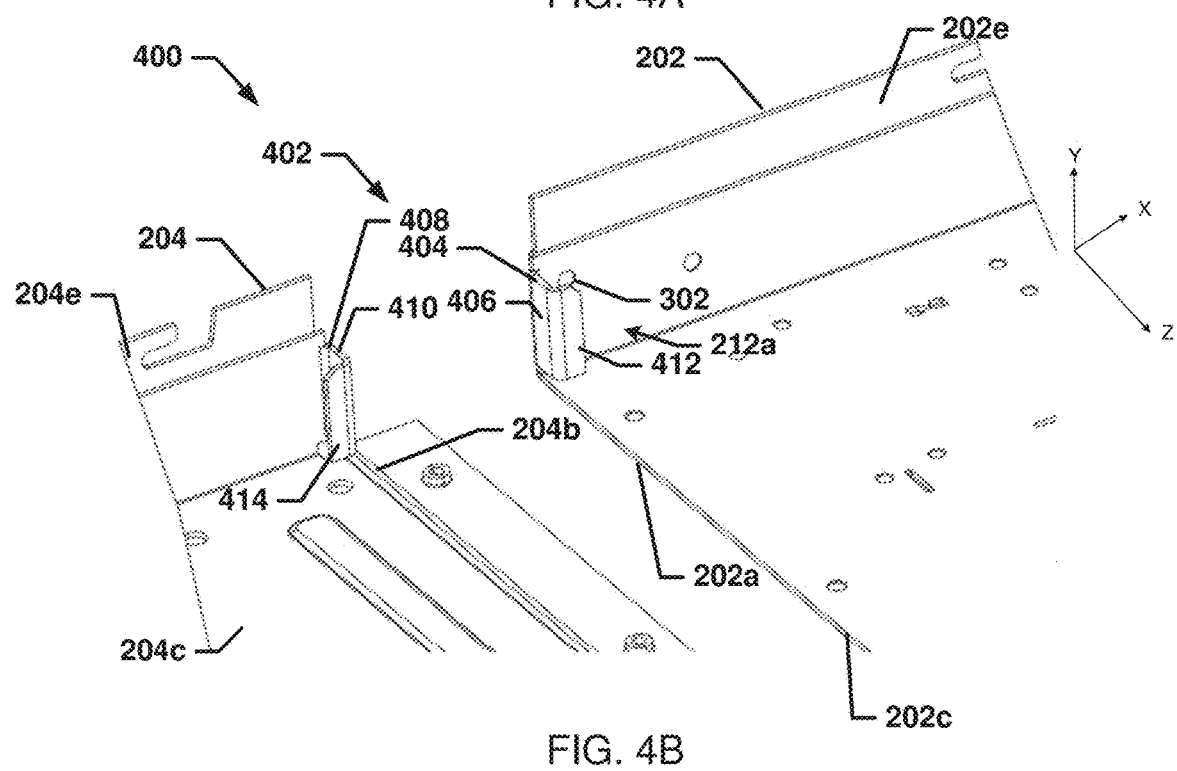
FIG. 4B is an isometric view illustrating an embodiment of the leveling subsystem on the split chassis of FIG. 4A.

Referring now to FIGS. 4A and 4B, an embodiment of a split chassis system 400 is illustrated. In an embodiment, the split chassis system 400 may be the split chassis system 201 of FIG. 2 with additional features that are provided to address the issues discussed above. For example, in addition to the components of the split chassis system 201 of FIG. 2, the split chassis system 400 may also include a leveling subsystem 402. The leveling subsystem 402 may include a first chassis leveling subsystem portion 404 that includes a first flange 406 extending from the first chassis front face 202a. The leveling subsystem 402 may also include a second chassis leveling subsystem portion 408 that includes a second flange 410 extending from the second chassis rear face 204b. The first flange 406 and the second flange 410 may be configured such that when the second chassis rear face 204b of the second chassis base portion 204 is positioned adjacent the first chassis front face 202a of the first chassis base portion 202, the first flange 406 and the second flange 410 engage each other in a manner that helps to substantially maintain the coplanarity of the first chassis base portion 202 and the second chassis base portion 204 when the first chassis coupling member 212a is coupled to the second chassis coupling member 214a. For example, the first flange 406 and the second flange 410 may be configured to engage and prevent rotation of the second chassis base portion 204 about the Z-axis in relation to the first chassis base portion 202 such that the coplanarity along the XZ-plane is within a tolerance. The flanges 406 and 410 are additionally advantageous because the manufacturing tolerances of flanges 406 and 410 are in the X direction, and will not impact coplanarity on the XZ plane. The flanges 406 and 410 will move in the X direction based on tolerances, but the angle of the flanges 406 and 410 in the YZ plane may be perpendicular or substantially perpendicular to XZ, and thus the flanges 406 and 410 will not impact the XZ plane coplanarity of the chassis 202.

In an embodiment, the first flange 406 and the second flange 410 may be coupled together by a flange coupling member, an embodiment of which is described in more detail in FIGS. 5A, 5B, 11A, 11B, 11C, and 11D below. As described below, the flange coupling member may couple the first flange 406 to the second flange 410 in order to maintain the adjacent, engaged orientation of the first flange 406 and the second flange 410 that provides for the substantial coplanarity of the first chassis base portion 202 and the second chassis base portion 204 when the first chassis coupling member 212a and the second chassis coupling member 214a are coupled to each other.

In an embodiment, the first chassis leveling subsystem portion 404 may also include a first flange edge 412 extending from the first flange 406, and the second chassis leveling subsystem portion 408 may include a second flange edge 414 extending from the second flange 410. The first flange edge 412 and the second flange edge 414 may engage a sleeve on the flange coupling member to couple the first flange 406 to the second flange 410 and align the first chassis base portion 202 and the second chassis base portion 204 such that the first chassis base portion 202 and the second chassis base portion 204 substantially maintain coplanarity in the XZ-plane. Similar to above, the manufacturing tolerances of flange edges 412 and 414 are in the Z direction, and may move in the Z-direction. However, the flange edges 412 and 414 are provided for clamping and tolerances on the flange edges 412 and 414 do not impact coplanarity on the XZ plane of the first chassis base portion 202 and the second chassis base portion 204.

Figure 5A:
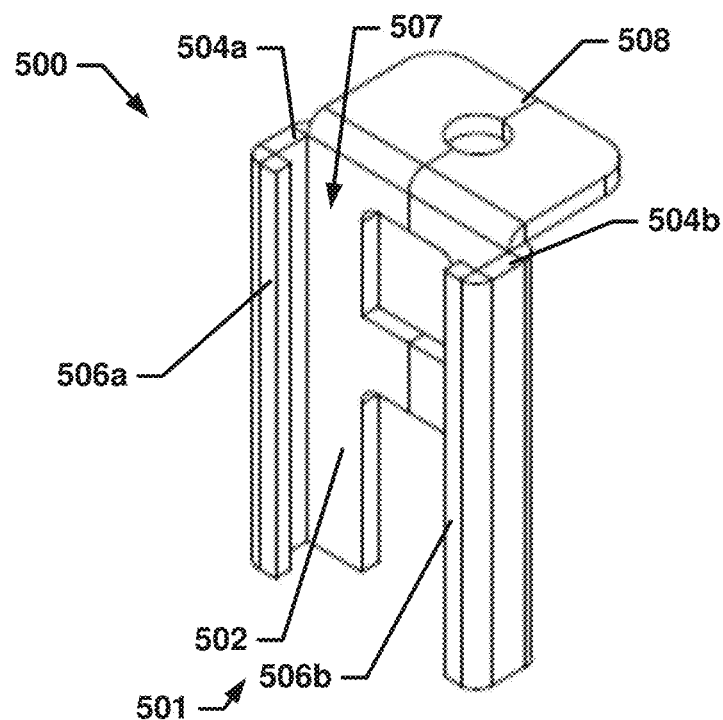
FIG. 5A is an isometric front view illustrating an embodiment of a flange coupling member used with the leveling subsystem illustrated in FIG. 4A.
Figure 5B:
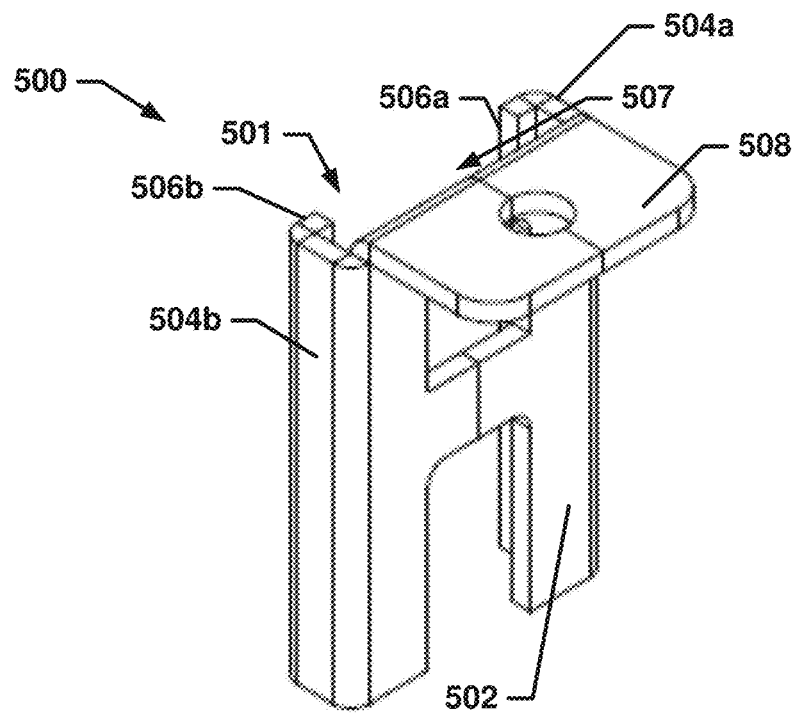
FIG. 5B is an isometric rear view illustrating an embodiment of the flange coupling member of FIG. 5A.

Referring now to FIGS. 5A and 5B, an embodiment of a flange coupling member 500 is illustrated. In an embodiment, the flange coupling member 500 may include a sleeve 501. In the illustrated example, the sleeve 501 may provide a C-shaped track that includes a rear wall 502, a first front wall 506a and a second front wall 506b that are located opposite the sleeve 501 from the rear wall 502, a first side wall 504a that extends between the rear wall 502 and the first front wall 506a, and a second side wall 504b that is located opposite the sleeve 501 from the first side wall 504a and that extends between the rear wall 502 and the second front wall 506b. The rear wall 502, the first side wall 504a, the second side wall 504b, the first front wall 506a, and the second front wall 506b on the flange coupling member 500 define a volume 507 that is configured to receive the first chassis leveling subsystem portion 404 and the second chassis leveling subsystem portion 408 of FIG. 4 such that the first flange 406 is coupled to the second flange 410 and the first flange edge 412 and the second flange edge 414 are engaged by the walls of the sleeve 501. The flange coupling member 500 may also include a tab 508 that extends from rear wall 502 and that may assist a user in sliding the sleeve 501 of the flange coupling member 500 on or off of the leveling subsystem 402. In yet another embodiment, the flange coupling member 500 may be flexible (e.g., having a spring rate) such that the sleeve 501 is configured to expand and/or contract to allow the sleeve 501 to accommodate varying tolerances of the first chassis leveling subsystem portion 404 and the second chassis leveling subsystem portion 408. Specifically, flange edges 412 and 414 could be extended or shorter based on tolerances in the Y-direction variation. Thus, the coupling member 500 is configured to keep the surfaces of the flanges 406 and 410 that are adjacent each other coplanar in the YZ-plane, which, as explained above, maintains the substantial coplanarity of first chassis base portion 202 and the second chassis base portion 204 in the XZ-plane.

Figure 6:
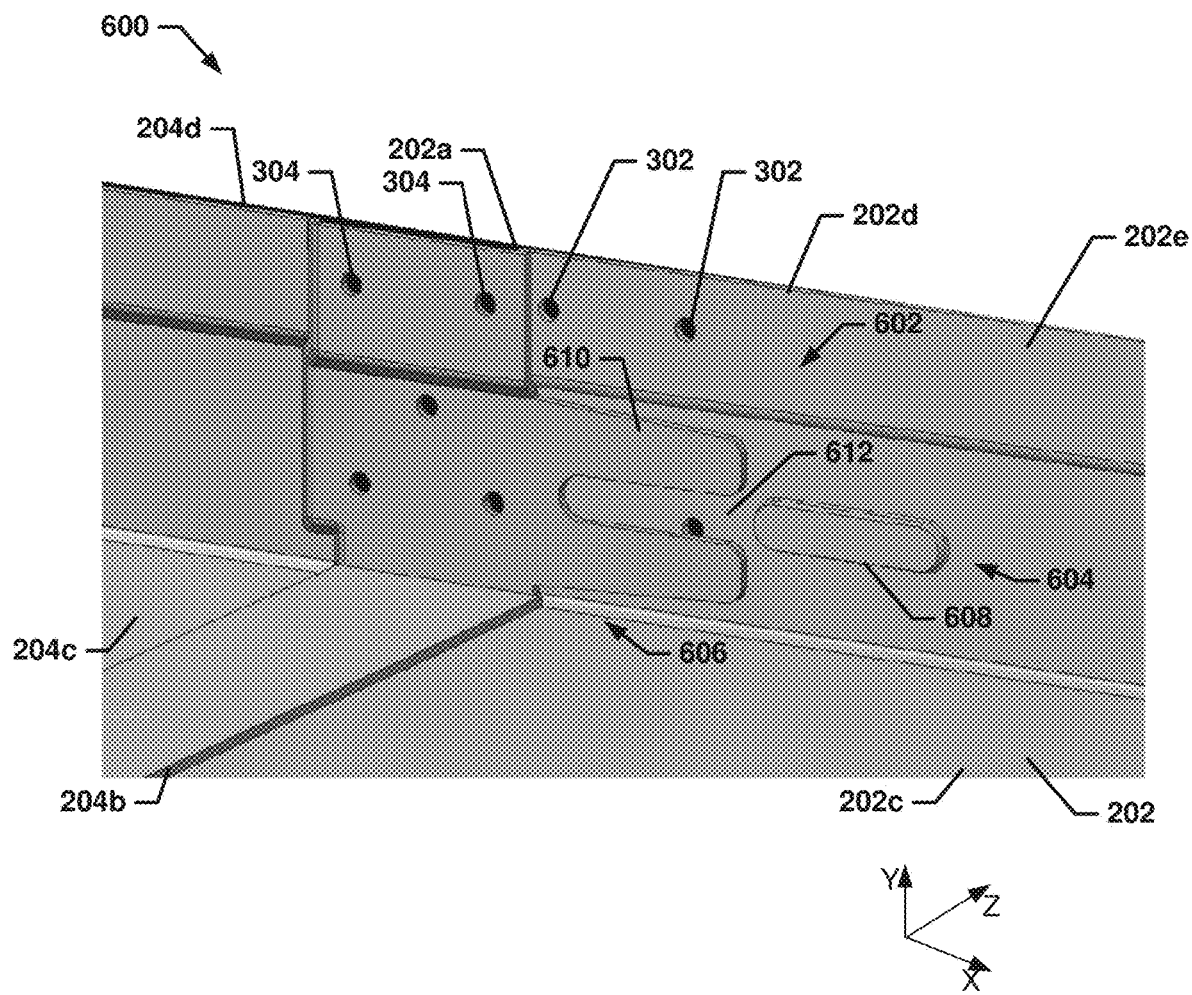
FIG. 6 is an isometric view illustrating an embodiment of a split chassis system with an inner wall that includes a leveling subsystem used with the modular system of FIG. 2.

Referring now to FIG. 6, an embodiment of a split chassis system 600 is illustrated. In an embodiment, the split chassis system 600 may be the split chassis system 201 of FIG. 2 with additional features that are provided to address the issues discussed above. For example, in addition to the components of the split chassis system 201 of FIG. 2, the split chassis system 600 may include a leveling subsystem 602. The leveling subsystem 602 may include a first chassis leveling subsystem portion 604 that is provided on the first chassis base portion 202, and a second chassis leveling subsystem portion 606 that is provided on the second chassis base portion 204. In an embodiment, the first chassis leveling subsystem portion 604 may include a first alignment member 608 that is located on at least one of the first chassis walls (e.g., the first chassis bottom wall 202c, the first chassis top wall 202d, the first chassis side wall 202e, and/or the first chassis side wall 202f). As illustrated in FIG. 6, the first alignment member 608 may include an obround form that is stamped, pressed, or otherwise extending from the interior of the first chassis side wall 202e. However, one of skill in the art in possession of the present disclosure will recognize that the first alignment member 608 may be provided with other shapes (e.g., rectangular, square, circular, triangular, oval, etc.) while remaining within the scope of the present disclosure. Furthermore, while the illustrated split chassis system 600 includes the first alignment member 608 extending from the interior of the first chassis side wall 202e, one of skill in the art will recognize that the first alignment member 608 may be located, alternatively or additionally, in different locations such as, for example, on the exterior of at least one of the first chassis walls 202c, 202d, 202e, and/or 202f.

In an embodiment, the second chassis leveling subsystem portion 606 may include a first receiving member 610 that is located on the second chassis rear face 204b and configured to engage the first alignment member 608 to align the first chassis base portion 202 and the second chassis base portion 204 such that the first chassis base portion 202 and the second chassis base portion 204 substantially maintain coplanarity. For example, the first receiving member 610 may be located on at least one of the second chassis walls (e.g., the second chassis bottom wall 204c, the second chassis top wall 204d, the second chassis side wall 204e, and/or the second chassis side wall 204f) and extend from the second chassis rear face 204b. As illustrated in FIG. 6, the first receiving member 610 may define a channel 612 that is configured to receive the first alignment member 608. For example, the first receiving member 610 may be configured to receive an obround form that is stamped, pressed, or that otherwise extends from the interior of the first chassis side wall 202e of the first chassis base portion 202. However, one of skill in the art in possession of the present disclosure will recognize that the first receiving member 610 may be configured to receive first alignment members having other shapes (e.g., rectangular, square, circular, triangular, oval, etc.) while remaining within the scope of the present disclosure. Furthermore, while the illustrated split chassis system 600 includes the first receiving member 610 on the interior of the second chassis side wall 204e, one of skill in the art in possession of the present disclosure will recognize that the first alignment member 608 may be located, alternatively or additionally, in different locations such as, for example, on the exterior of at least one of the second chassis walls 204c, 204d, 204e, and/or 204f.

In an embodiment, the first alignment member 608 and the first receiving member 610 may be configured to reduce a Z-axis angle variation, as discussed above, in order to maintain coplanarity of the first chassis base portion 202 and the second chassis base portion 204 in the XZ-plane. As would be understood by one of skill in the art in possession of the present disclosure, a reduction in the Z-axis angle variation, which is associated with the Y-direction variation, as discussed above, may be accomplished by extending the length of the first alignment member 608 in the X-direction. Thus, the length of the first alignment member 608 may be selected to minimize Z-axis angle variation in the Z-axis angle to establish coplanarity (e.g., a substantially 0 degree angle from the XZ-plane) such that the coplanarity of the first chassis base portion 202 and the second chassis base portion 204 is within a tolerance required for the split chassis system 201 to be inserted into a rack chassis.

Figure 7A:
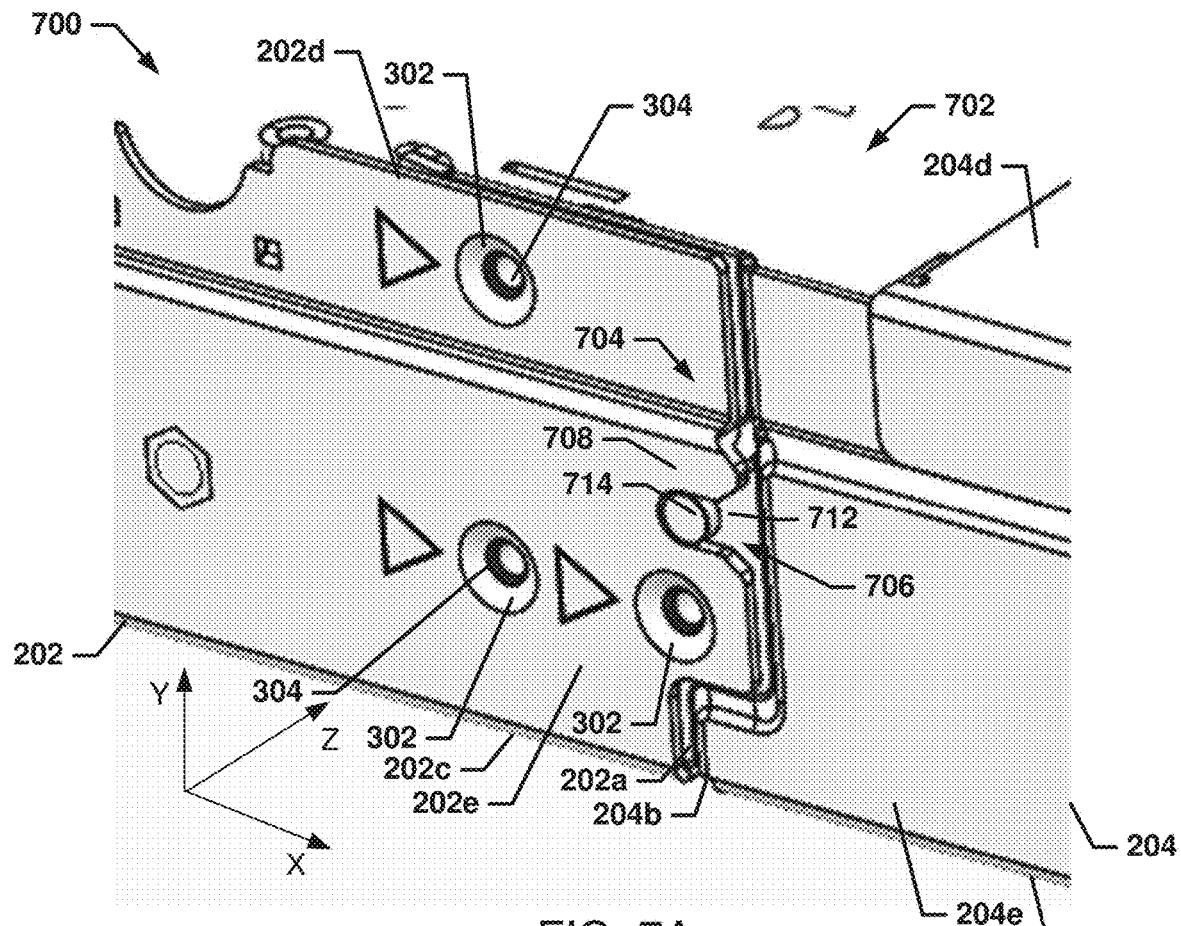
FIG. 7A is an isometric view illustrating an embodiment of a split chassis system with an outer wall that includes a leveling subsystem used with the modular system of FIG. 2.
Figure 7B:
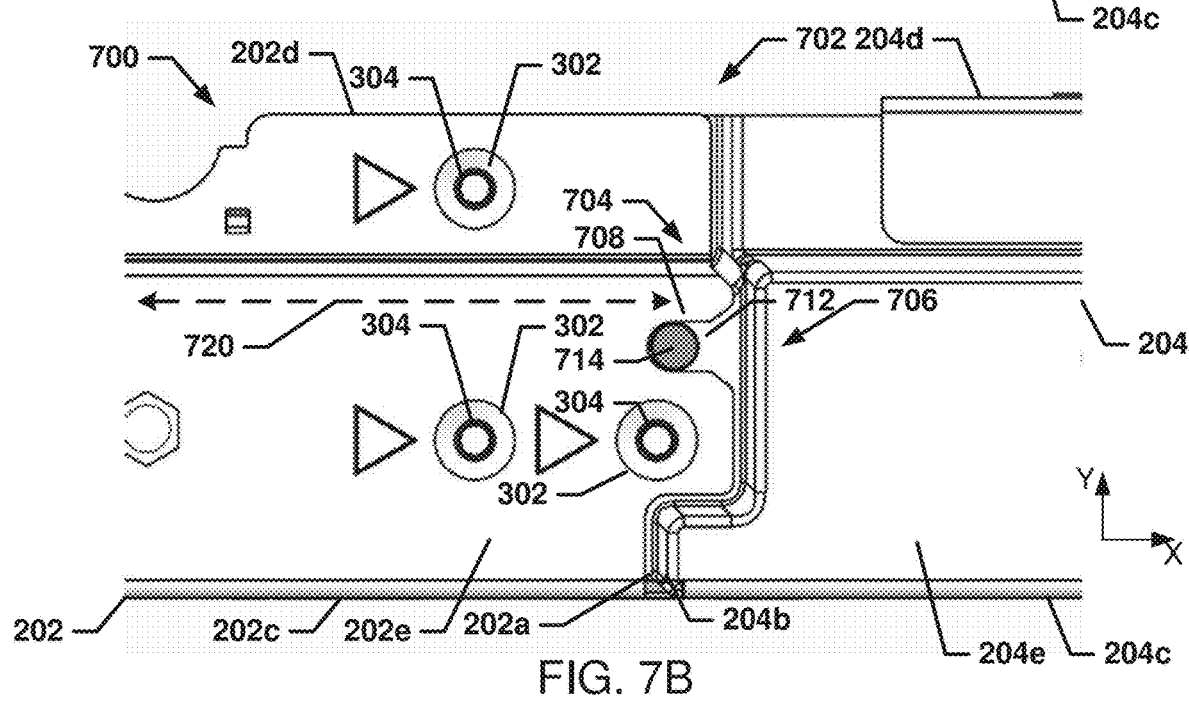
FIG. 7B is a side view illustrating an embodiment of the leveling subsystem included on the outer wall of the split chassis system of FIG. 7A.
Figure 7C:
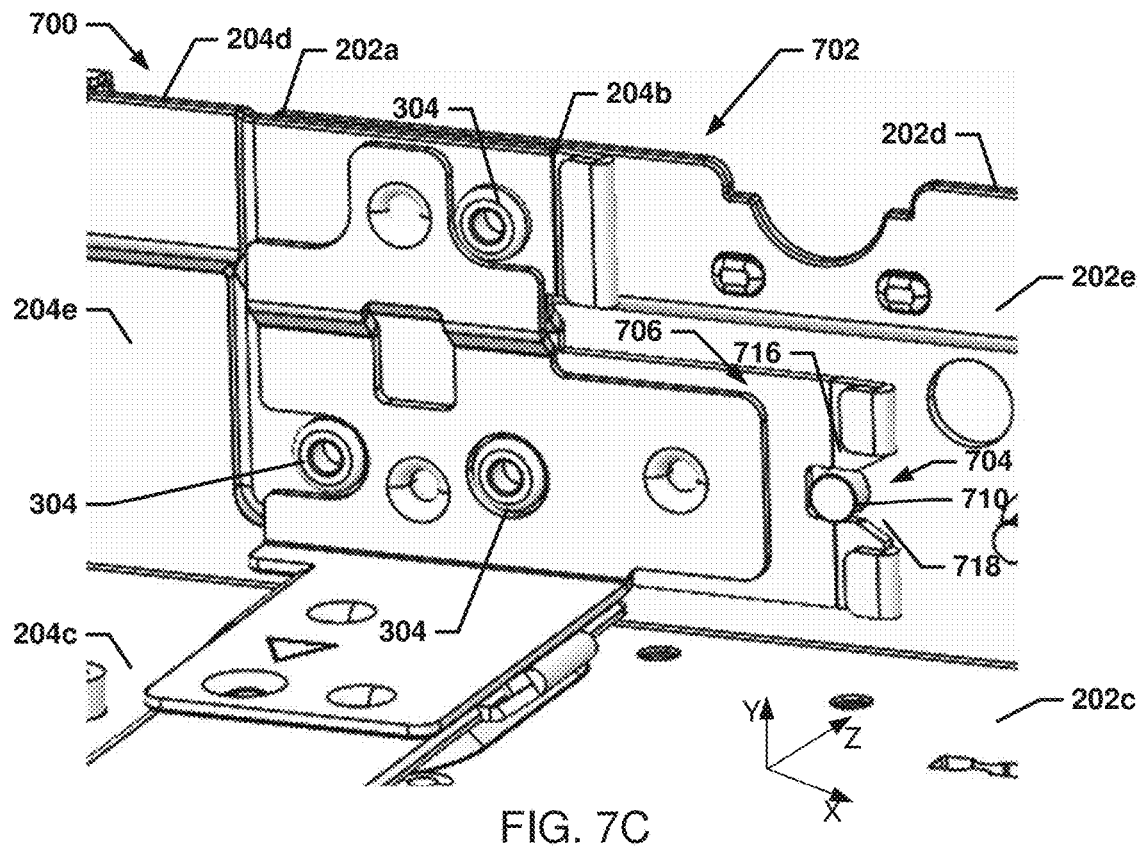
FIG. 7C is an isometric view illustrating an embodiment of the leveling subsystem included on an inner wall of the split chassis system of FIG. 7A.
Figure 7D:
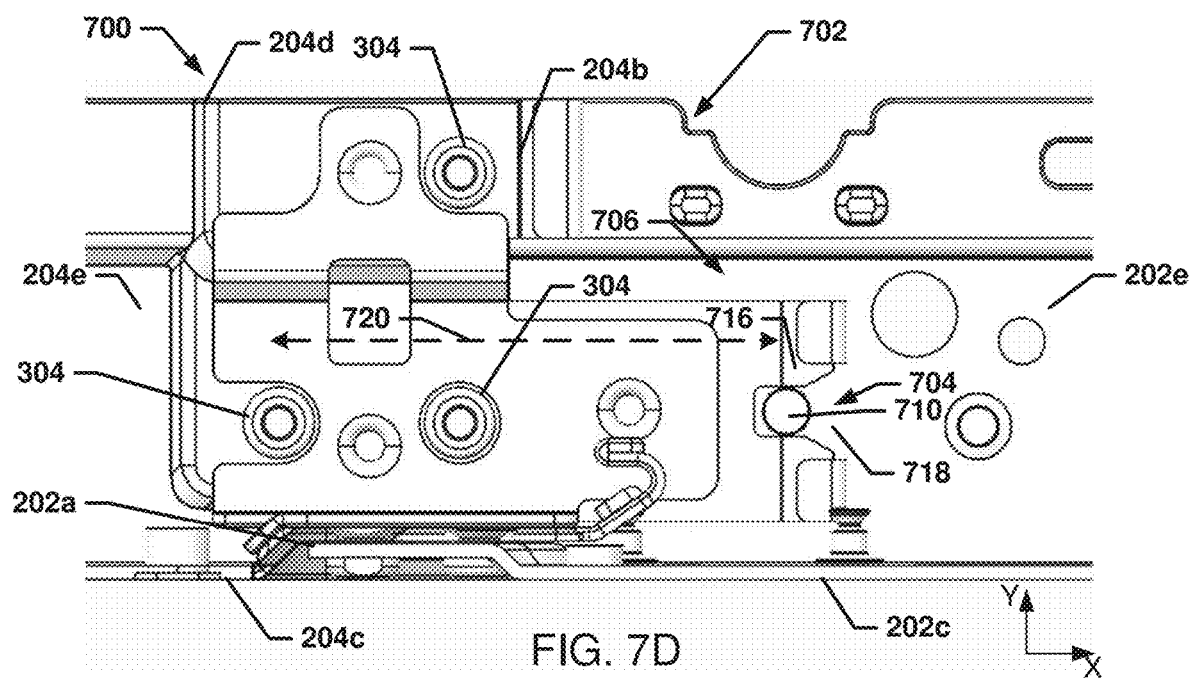
FIG. 7D is a side view illustrating an embodiment of the leveling subsystem included on the inner wall of the split chassis system of FIG. 7C.

Referring now to FIGS. 7A, 7B, 7C, and 7D, an embodiment of a split chassis system 700 is illustrated. In an embodiment, the split chassis system 700 may be the split chassis system 201 of FIG. 2 with additional features that are provided to address the issues discussed above. For example, in addition to the components of the split chassis system 201 of FIG. 2, the split chassis system 700 may include a leveling subsystem 702. The leveling subsystem 702 may include a first chassis leveling subsystem portion 704 that is provided on the first chassis base portion 202, and a second chassis leveling subsystem portion 706 that is provided on the second chassis base portion 204. In the specific example, the first chassis leveling subsystem portion 704 may include a first receiving member 708, as illustrated in FIGS. 7A and 7B, and a first alignment member 710, as illustrated in FIGS. 7C and 7D, each located on at least one of the first chassis walls (e.g., the first chassis bottom wall 202c, the first chassis top wall 202d, the first chassis side wall 202e, and/or the first chassis side wall 202f). In the illustrated example, the first receiving member 708 may be located on the exterior of the first chassis side wall 202e extending from the first chassis front face 202a, and the first alignment member 710 may be located on the interior of the first chassis side wall 202e. However, one of skill in the art in possession of the present disclosure will recognize that the first alignment member 710 and the first receiving member 708 may each be located on the interior of the first chassis side wall 202e, may each be located on the exterior of the first chassis side wall 202e, or the first receiving member 708 may be located on the interior of the first chassis side wall 202e and the first alignment member 710 may be located on the exterior of the first chassis side wall 202e, while still falling within the scope of the present disclosure.

As illustrated in FIGS. 7C-7D, the first alignment member 710 may include a circular stud that is stamped, pressed, or otherwise extending from the exterior of the first chassis side wall 202e. However, as would be understood by one of skill in the art in possession of the present disclosure, the first alignment member 710 may be provided with other shapes (e.g., rectangular, square, obround, triangular, oval, etc.) while still remaining within the scope of the present disclosure. The first receiving member 708 may define a channel 712 that is configured to receive a second alignment member 714, discussed below. For example, the first receiving member 708 may be configured to receive a circular stud that is stamped, pressed, or that otherwise extends from the interior of the second chassis side wall 204e of the second chassis base portion 204. However, one of skill in the art in possession of the present disclosure will recognize that the first receiving member 708 may be configured to receive second alignment members 714 having other shapes (e.g., rectangular, square, obround, triangular, oval, etc.) while remaining within the scope of the present disclosure.

In an embodiment, the second chassis leveling subsystem portion 706 may include a second alignment member 714, as illustrated in FIGS. 7A and 7B, and a second receiving member 716, as illustrated in FIGS. 7C and 7D, each located on at least one of the second chassis walls (e.g., the second chassis bottom wall 204c, the second chassis top wall 204d, the second chassis side wall 204e, and/or the second chassis side wall 204f). In the illustrated example, the second receiving member 716 may be located on the interior of the second chassis side wall 204e and extending from the second chassis rear face 204b, and the second alignment member 714 may be located on the exterior of the second chassis side wall 204e. However, one of skill in the art in possession of the present disclosure will recognize that the second alignment member 714 and the second receiving member 716 may both be located on the interior of the second chassis side wall 204e, may both be located on the exterior of the second chassis side wall 204e, or the second receiving member 716 may be located on the exterior of the second chassis side wall 204e and the second alignment member 714 may be located on the interior of the second chassis side wall 204e, while still falling within the scope of the present disclosure.

As illustrated in FIG. 7A, the second alignment member 714 may include a circular stud that is stamped, pressed, or that otherwise extends from the exterior of the second chassis side wall 204e. However, one of skill in the art in possession of the present disclosure will recognize that the second alignment member 714 may be provided with other shapes (e.g., rectangular, square, obround, triangular, oval, etc.) while still remaining within the scope of the present disclosure. The second receiving member 716 may define a channel 718 that is configured to receive the first alignment member 710, discussed above. For example, the channel 718 of the second receiving member 716 may be configured to receive a circular stud that is stamped, pressed, or that otherwise extends from the exterior of the first chassis side wall 202e of the second chassis base portion 204. However, it would be apparent to one of skill in the art in possession of the present disclosure that the second receiving member 716 may be configured to receive first alignment members 710 having other shapes (e.g., rectangular, square, obround, triangular, oval, etc.) and still fall within the scope of the present disclosure.

In an embodiment, the first alignment member 710 and the second alignment member 714 may be configured to reduce Z-axis angle variation, discussed above, to maintain coplanarity of the first chassis base portion 202 and the second chassis base portion 204 in the XZ-plane. As discussed above, the distance 720 between the first alignment member 710 and the second alignment member 714 may be configured to minimize variance in the Z-axis angle for coplanarity, discussed above, such that the coplanarity of the first chassis base portion 202 and the second chassis base portion 204 is within a tolerance required for the split chassis system 201 to be inserted into a rack chassis when the first chassis base portion 202 and the second chassis base portion 204 are coupled by the first chassis coupling members 212a and/or 212b and the second chassis coupling members 214a and/or 214b.

Figures 8C, 8D:
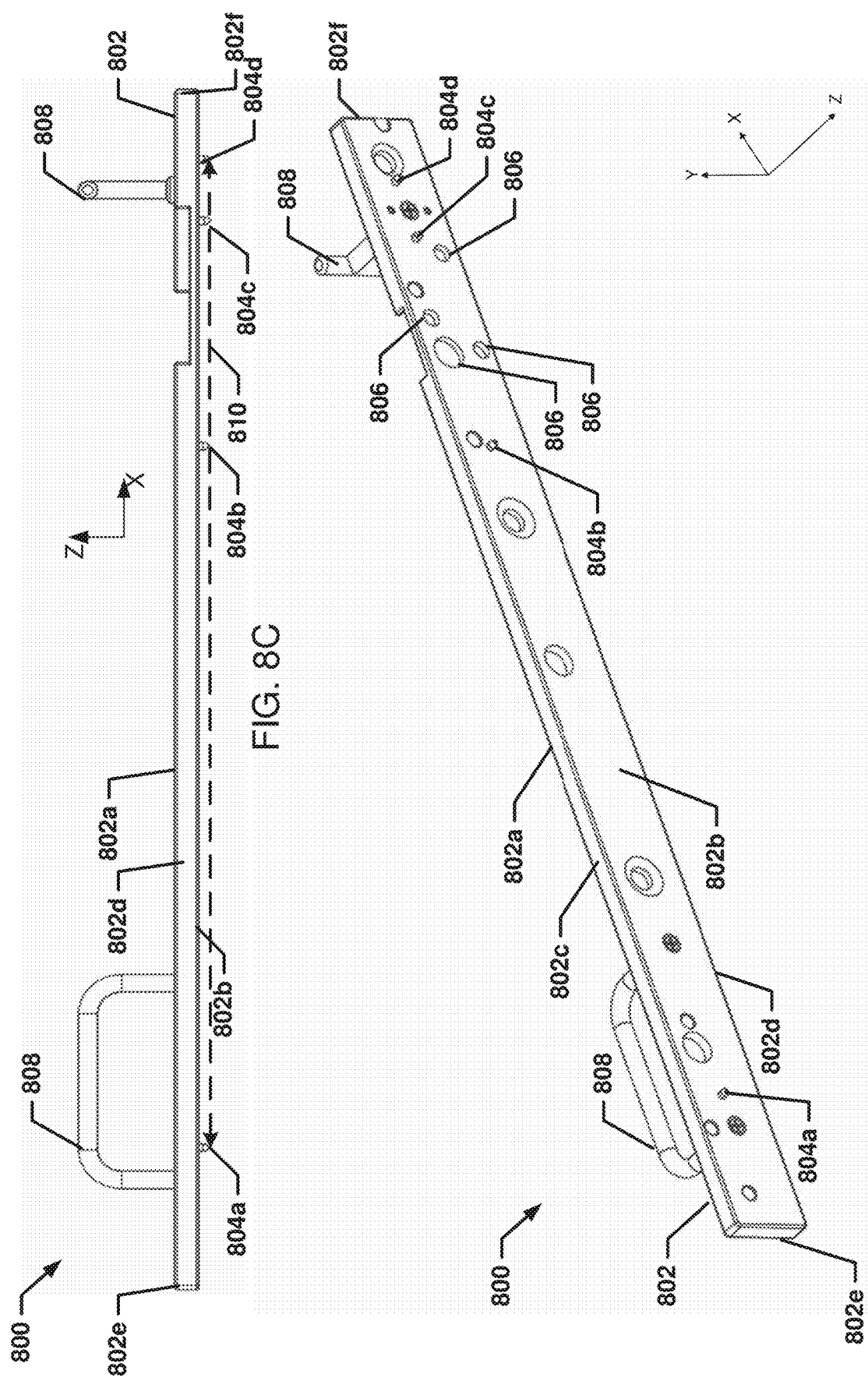
FIG. 8C is a top view illustrating an embodiment of the fixture member of FIG. 8A.
FIG. 8D is a rear, isometric view illustrating an embodiment of the fixture member of FIG. 8A.

Referring now to FIG. 8, a leveling subsystem 800 for maintaining coplanarity of the split chassis system 201 is illustrated. In an embodiment, the leveling subsystem 800 includes a fixture member 802. The fixture member 802 includes a fixture member front face 802a, a fixture member rear face 802b that is located opposite the fixture member 802 from the fixture member front face 802a, a fixture member bottom face 802c extending between the fixture member front face 802a and the fixture member rear face 802b, a fixture member top face 802d located opposite the fixture member 802 from the fixture member bottom face 802c and extending between the fixture member front face 802a and the fixture member rear face 802b, and a pair of fixture member side faces 802e and 802f that are located opposite each other on the fixture member 802 and that each extend between the fixture member front face 802a, the fixture member rear face 802b, the fixture member bottom face 802c, and the fixture member top face 802d.

The fixture member 802 may include a plurality of fixture member alignment members 804a, 804b, 804c, and/or 804d. The fixture member alignment members 804a-804d may extend from the fixture member rear face 802b and are configured to be coupled to the first chassis base portion 202 and the second chassis base portion 204 in order to maintain coplanarity of the first chassis base portion 202 and the second chassis base portion 204. For example, a first fixture member alignment member 804a and/or 804b may be configured to be received by a receiving member located on at least one of the first chassis side walls 202e and/or 202f, and the second fixture member alignment member 804c and/or 804d may be configured to be received by a receiving member located on at least one of the second chassis side walls 204e and/or 2024f. In the illustrated example, the fixture member alignment members 804a-804d may be pins that may each be received by corresponding receiving members defined on at least one of the walls of the first chassis base portion 202 and at least one of the walls of the second chassis base portion 204. The receiving members, discussed below in FIGS. 11A-11B, may be apertures through one of the walls of the first chassis base portion 202 and the second chassis base portion 204.

In an embodiment, the fixture member 802 may include a plurality of access apertures 806 that are configured to provide access to the first chassis coupling member 212a and/or 212b and the second chassis coupling member 214a and/or 214b when the fixture member 802 is coupled to the first chassis base portion 202 and the second chassis base portion 204. In various embodiments, the leveling subsystem 800 may include at least one handle 808 that is coupled to the fixture member front face 802a and configured to allow a user to position the leveling subsystem 800 adjacent the first chassis base portion 202 and the second chassis base portion 204 such that the fixture member alignment members 804a-804d may be inserted into the receiving members (e.g., receiving members 812a, 812b, 812c, and 812d illustrated in FIG. 11A below) of the first chassis base portion 202 and the second chassis base portion 204. The fixture member alignment members 804*a*-804*d* me be configured to couple with a respective receiving member on the first chassis base portion 202 and the second chassis base portion 204 to maintain a frictional coupling but also to allow the leveling subsystem 800 to adjust the chassis base portions 202 and 204 to a position of substantial coplanarity despite variations in the receiving members in the chassis base portions 202 and 204.

In an embodiment, the leveling subsystem 800 may include a plurality of fixture member coupling members 807 that may be used to couple the fixture member 802 of the leveling subsystem 800 to a wall of the first chassis base portion 202 and a wall of the second chassis base portion 204. For example, the fixture member coupling members 807 may include a magnet that causes the fixture member 802 to engage the split chassis system 201 via magnetic attraction such that a user may let go of the at least one handle 808 used by the user to position the fixture member alignment members 804*a*-804*d* into the receiving members of the first chassis base portion 202 and the second chassis base portion. The user then may couple the first chassis coupling member 212*a*/212*b* to the second chassis coupling member 214*a*/214*b* through the access apertures 806 without having to hold the leveling subsystem 800 in position, and thus assembling the split chassis system 201. The user then can pull on the handles 808 with enough a force that overcomes the magnetic force of the fixture member coupling members 807 with the split chassis system 201 such that the leveling subsystem 800 disengages from the split chassis system 201.

In an embodiment, the first fixture member alignment member 804*a* and/or 804*b* and the second fixture member alignment member 804*c* and/or 804*d* may be configured to reduce Z-axis angle variation, discussed above, to substantially maintain coplanarity of the first chassis base portion 202 and the second chassis base portion 204 in the XZ-plane. As discussed above, the distance 810 between the first fixture member alignment member 804*a* and/or 804*b* and the second fixture member alignment member 804*c* and/or 804*d* may be configured to minimize variance in the Z-axis angle for coplanarity, discussed above, when the first chassis base portion 202 and the second chassis base portion 204 are coupled by the first chassis coupling members 212*a* and/or 212*b* and the second chassis coupling members 214*a* and/or 214*b* such that, when the fixture member 802 is disconnected from the first chassis base portion 202 and the second chassis base portion 204, the coplanarity of the first chassis base portion 202 and the second chassis base portion 204 is within a tolerance required for the split chassis system 201 to be inserted into a rack chassis. In a specific example, the distance 810 may be the distance between the first fixture member alignment member 804*a* and the second fixture member alignment member that minimizes the Z-axis angle variance.

Referring now to FIG. 9, an embodiment of a method 900 for maintaining coplanarity of portions of a split chassis system is illustrated. As discussed below, the systems and method of the present disclosure provide for assembly of a split chassis system by positioning a first chassis base portion that houses a first component adjacent to a second chassis base portion that houses a second component, and coupling the first chassis base portion to the second chassis base portion such that they substantially maintain coplanarity. The split chassis system itself allows system design and supply chain flexibility in enabling different combinations of front and rear types of information handling subsystems, in which otherwise an entirely new unique chassis must be designed and managed. A second or alternative configuration may be created with a second chassis base portion being replaced with another second chassis base portion with minimal interruption to the factory operations of the first chassis base portion. The split chassis system may also include a leveling subsystem that is configured to substantially maintain the coplanarity of the first chassis base portion in relation to the second chassis base portion such that the split chassis system is within a height tolerance of slots in a rack chassis.

The method 900 begins at block 902 where a first chassis base portion is positioned adjacent a second chassis base portion. The method 900 is described below with reference to FIGS. 10A and 10B, which illustrates the operation of the embodiment of the split chassis system 400 of FIGS. 4A and 4B according to the method 900. The method 900 is also described below with reference to FIG. 11A, which illustrates the operation of the split chassis system 201 of FIGS. 2 and 3A-3E according to the method 900 and using the leveling subsystem 800 of FIG. 8. While not illustrated, one of skill in the art in possession of the present disclosure will recognize that the method 900 may be performed using the split chassis system 600 of FIG. 6, or the split chassis system 700 of FIGS. 7A-7D, in substantially the manner described above without departing from the scope of the present disclosure.

Figure 10A:
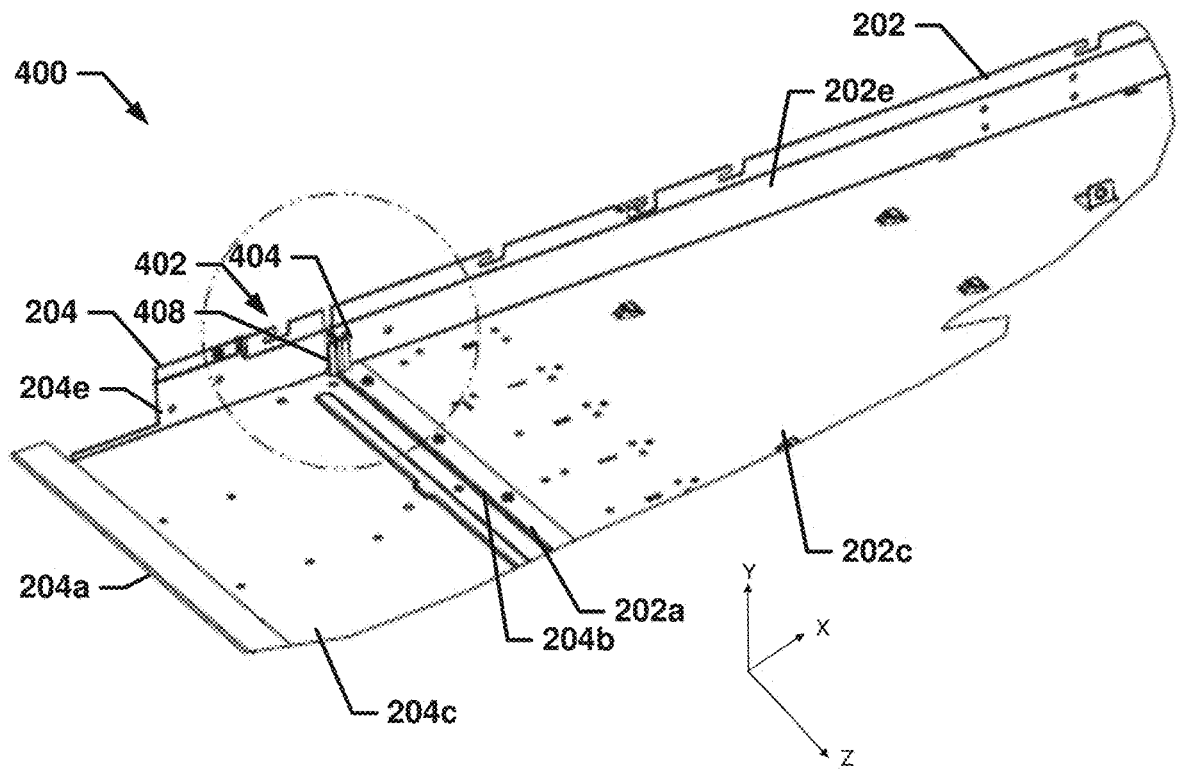
FIG. 10A is an isometric interior view illustrating an embodiment of a split chassis system that includes a leveling subsystem of FIGS. 4A and 4B.
Figure 10B:
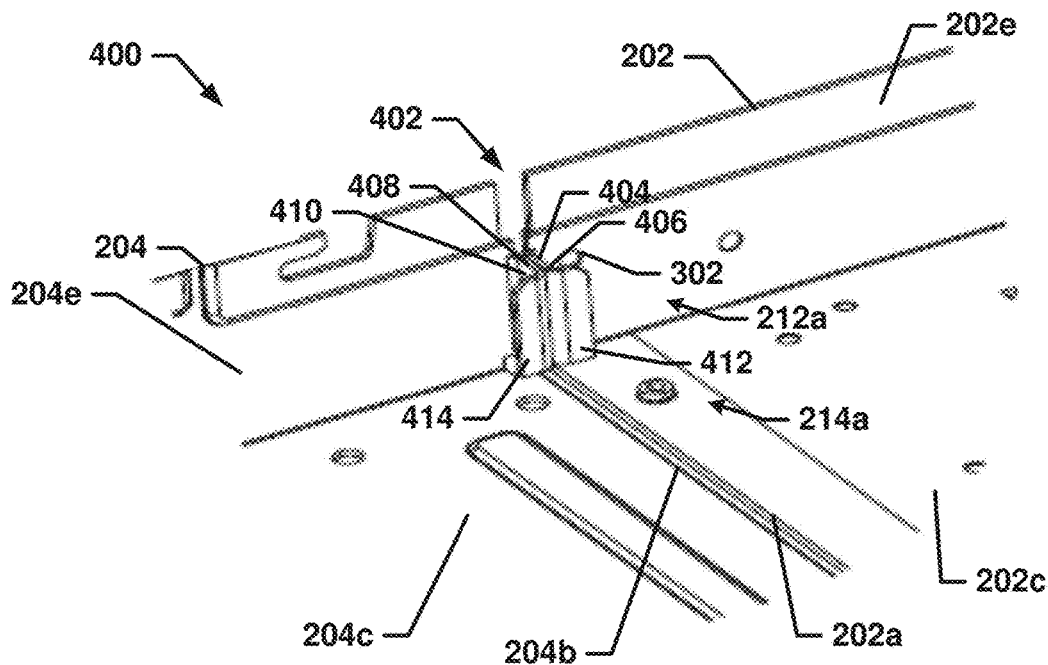
FIG. 10B is an isometric interior view illustrating an embodiment of the leveling subsystem included in the split chassis system of FIG. 10A.
Figure 11A:
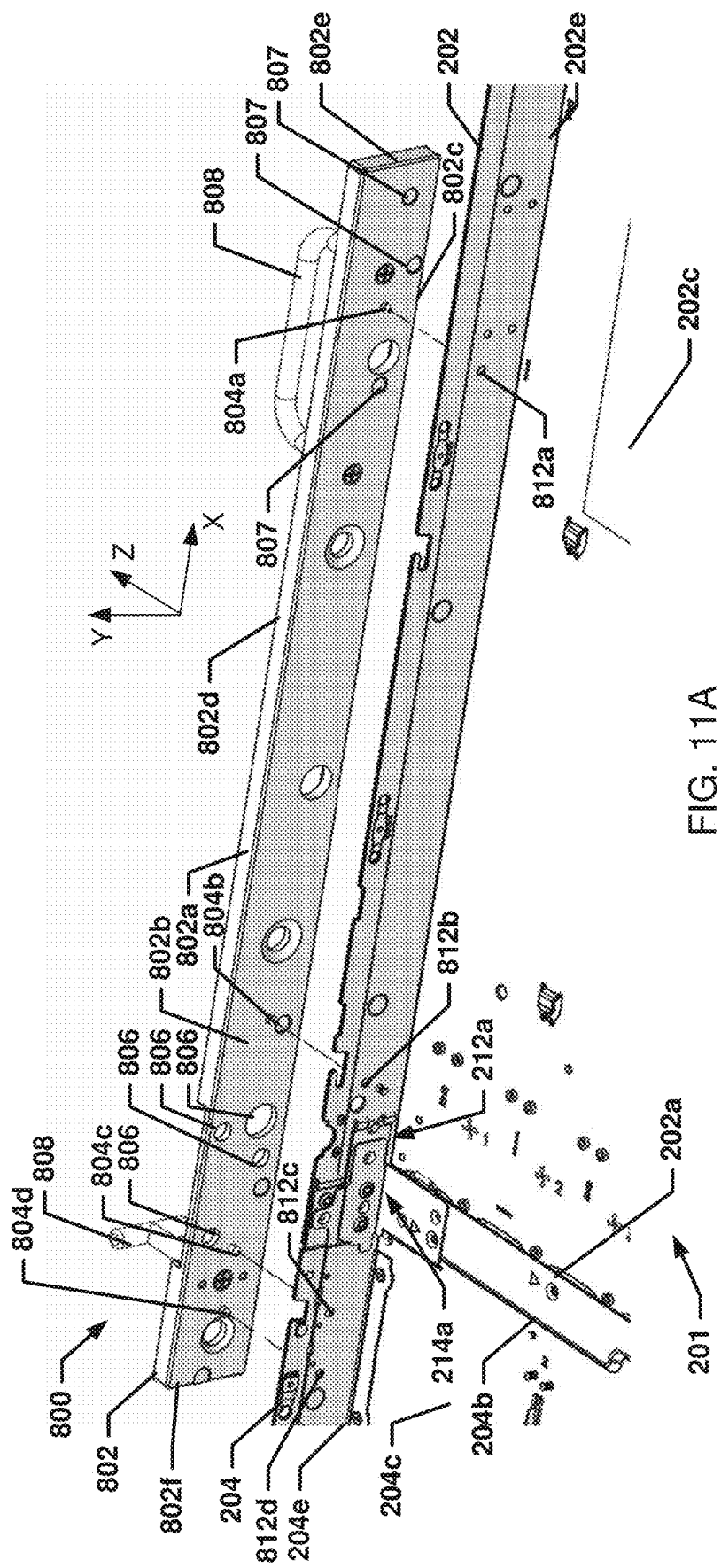
FIG. 11A is an isometric front view illustrating an embodiment of the fixture member of FIGS. 8A-9D being coupled to the split chassis system of FIGS. 3A-3E.
Figure 11B:
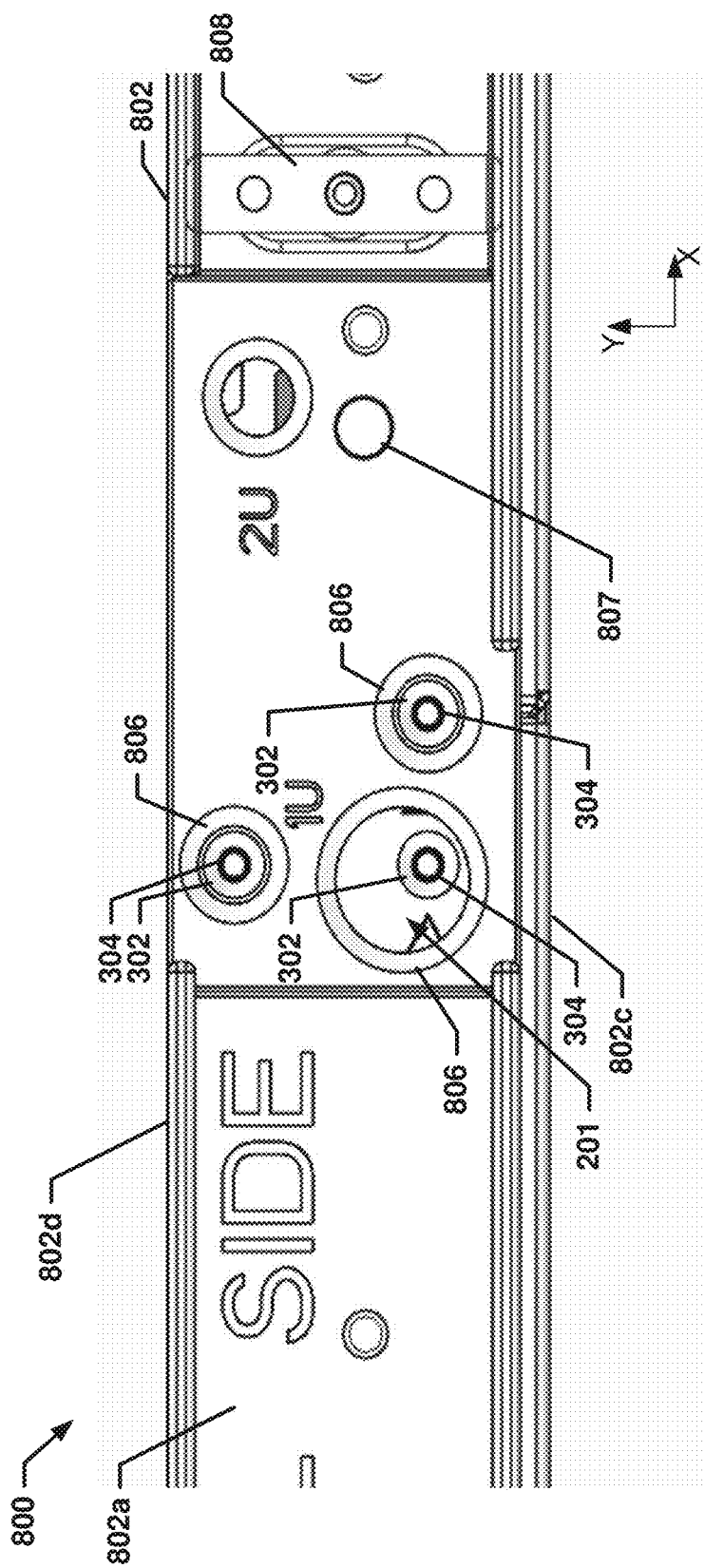
FIG. 11B is a front view illustrating an embodiment of the fixture member of FIG. 11A after the fixture member has been attached to a split chassis system, and providing access to coupling members on the split chassis system.

As illustrated in FIGS. 10A and 10B, the first chassis base portion 202 may be positioned adjacent the second chassis base portion 204 at block 902. For example, the first chassis front face 202*a* of the split chassis system 400 may be positioned adjacent to the second chassis rear face 204*b* such that the first flange 406 of the first chassis leveling subsystem portion 404 engages the second flange 410 of the second chassis leveling subsystem portion 408. Similarly, as illustrated in FIG. 11A, the first chassis front face 202*a* of the split chassis system 201 may be positioned adjacent to the second chassis rear face 204*b* such that the first chassis coupling member 212*a* and/or 212*b* are aligned with the second chassis coupling member 214*a* and/or 214*b*, respectively. One of skill in the art in possession of the present disclosure will recognize that the first chassis base portion 202 may be positioned adjacent the second chassis base portion 204 on each of the split chassis system 600 and the split chassis system 700 may be positioned adjacent each other in a substantially similar manner.

Figure 10C:
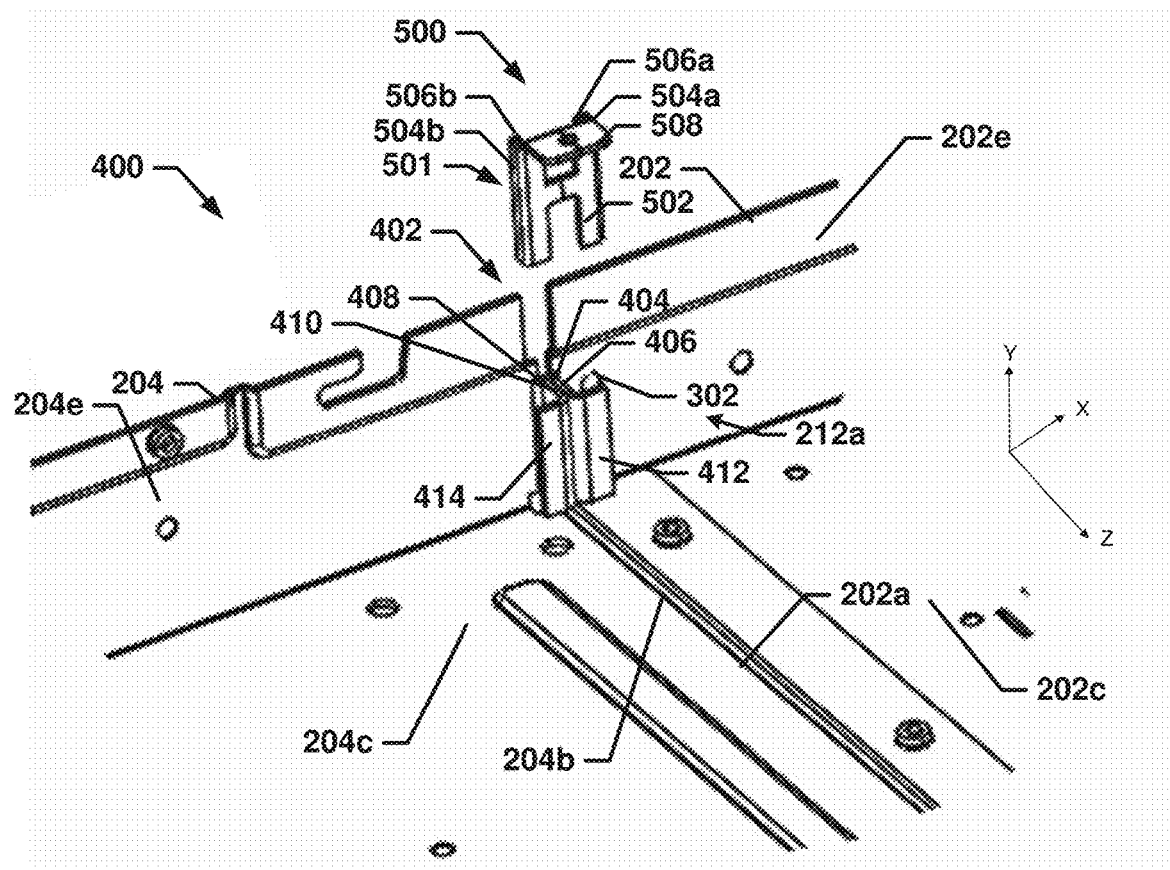
FIG. 10C is an isometric view illustrating an embodiment of the leveling subsystem of FIG. 10A prior to engagement with the flange coupling member of FIGS. 5A and 5B.
Figure 10D:
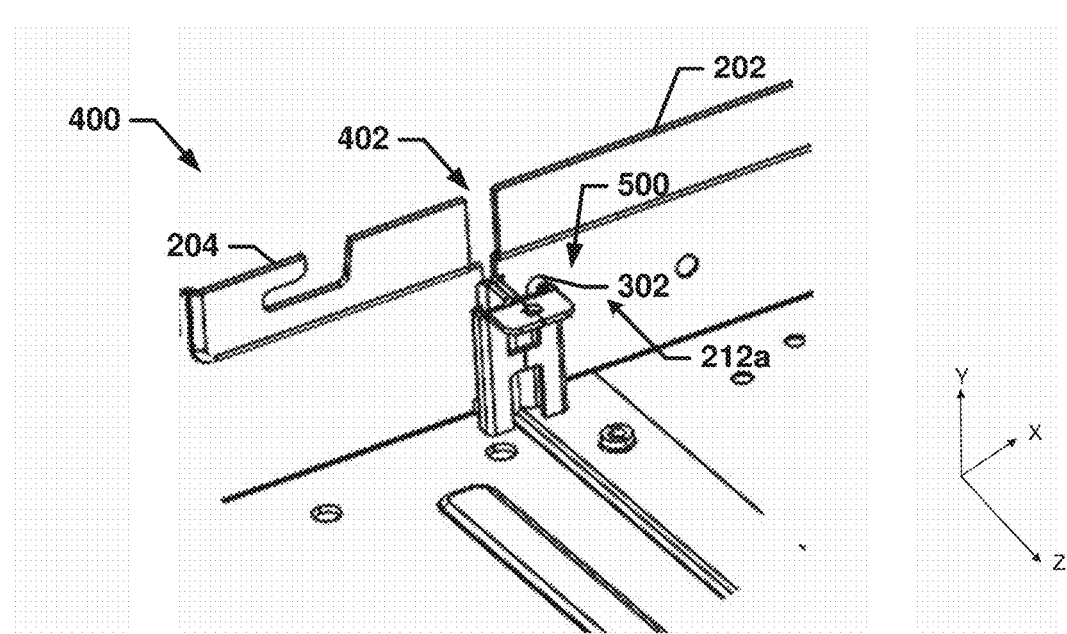
FIG. 10D is an isometric interior view of the flange coupling member of FIGS. 5A and 5B engaged with flange edges of the leveling coupling member of FIG. 10C.

The method 900 then proceeds to block 904 where the first chassis base portion and the second chassis base portion are aligned to be substantially coplanar with each other using a leveling subsystem. Referring to FIGS. 10A-10D, the leveling subsystem 402 provided for the split chassis system 400 may align the first chassis base portion 202 with the second chassis base portion 204 such that the first chassis base portion 202 and the second chassis base portion 204 are substantially coplanar with each other. As discussed above, the first chassis base portion 202 and the second chassis base portion 204 are substantially coplanar with each other when the coplanarity of the first chassis base portion 202 and the second chassis base portion 204 is within a tolerance of coplanarity that allows the split chassis system 201 to be inserted into a rack chassis envelope (e.g., an available rack slot height) and maintain desired functionality. The leveling subsystem 402 aligns the first chassis base portion 202 and the second chassis base portion 204 when the flange coupling member 500 couples the first flange 406 with the second flange 410. For example, the sleeve 501 included on the flange coupling member 500 may be provided on and/or pressed over the first flange edge 412 and the second flange edge 414, as illustrated in FIGS. 10C and 10D. For example, the sleeve 501 may engage the first flange edge 412 and the second flange edge 414 such that the sleeve 501 absorbs any bend tolerances in the first flange edge 412 and the second flange edge 414. Thus, when the flange coupling member 500 couples the first flange 406 and the second flange 410, the leveling subsystem aligns the first chassis base portion 202 and the second chassis base portion 204 such that the first chassis base portion 202 and the second chassis base portion 204 maintain substantial coplanarity in the XZ-plane because the orientation of the first flange 406 and second flange 410, and/or the first flange edge 412 and the second flange edge 414 have tolerances that impact different planes such as the YZ plane.

Referring to FIG. 11A, at block 904 the leveling subsystem 800 may be coupled to the first chassis base portion 202 and the second chassis base portion 204. The leveling subsystem 800 may be configured such that when the leveling subsystem 800 is coupled to the first chassis base portion 202 and the second chassis base portion 204, the leveling subsystem 800 aligns the first chassis base portion 202 and the second chassis base portion 204 to substantially maintain coplanarity with each other. As discussed above, the first chassis base portion 202 and the second chassis base portion 204 are substantially coplanar with each other when the coplanarity of the first chassis base portion 202 and the second chassis base portion 204 is within a tolerance of coplanarity that allows the split chassis system 201 to be inserted into a rack chassis envelope (e.g., an available rack slot height) and maintain desired functionality. In the specific example, illustrated in FIG. 11A, the fixture member alignment members 804a-804d included on the fixture member rear face 802b may be inserted into a respective receiving member 810a and 810b included on the first chassis side wall 202e and a respective receiving member 810c and 810d included on the second chassis side wall 204e. At least one fixture member coupling member 807 may couple the fixture member 802 to the first chassis side wall 202e and the second chassis side wall 204e. Thus, when the fixture member alignment member 804a-804d are inserted into the respective receiving members 812a-812d, the fixture member 802 aligns the first chassis base portion 202 and the second chassis base portion 204 such that the first chassis base portion 202 and the second chassis base portion 204 substantially maintain coplanarity.

While not illustrated, one of skill in the art in possession of the present disclosure will recognize how, at block 904, in the split chassis system 600, the first chassis leveling subsystem portion 604 that is provided on the first chassis base portion 202 and the second chassis leveling subsystem portion 606 that is provided on the second chassis base portion 204 may engage to provide for the alignment/coplanarity of the first chassis base portion 202 and the second chassis base portion 204. Similarly, one of skill in the art in possession of the present disclosure will recognize how, at block 904, in the split chassis system 700, the features provided on the first chassis base portion 202 and the second chassis base portion 204 may engage to provide for the alignment/coplanarity of the first chassis base portion 202 and the second chassis base portion 204.

The method 900 then proceeds to block 906 where a first chassis coupling member included on at least one first chassis wall of the first chassis base portion is coupled to a second chassis coupling member included on at least one wall of the second chassis base portion. Referring to FIGS. 10C and 10D, the first chassis coupling member 212a of the first chassis side wall 202e may be coupled to the second chassis coupling member 214a included on the second chassis side wall 204e after the leveling subsystem 402 has aligned the first chassis base portion 202 and the second chassis base portion 204 to substantially maintain coplanarity. For example, a fastener may be inserted into the aperture 302 of first chassis coupling member 212a, and a fastener may be inserted into the aperture 304 of the second chassis coupling member 214a, when the apertures 302 and 304 are aligned. The leveling subsystem 402 maintains the coplanarity of the first chassis base portion 202 to the second chassis base portion 204 during the coupling of the first chassis base portion 202 to the second chassis base portion 204 when assembling the split chassis system 400. One of skill in the art in possession of the present disclosure will recognize that the first chassis coupling member included on at least one first chassis wall of the first chassis base portion 202 may be coupled to a second chassis coupling member included on at least one wall of the second chassis base portion 204 on each of the split chassis system 600 and the split chassis system 700 in a substantially similar manner Similarly, referring to FIGS. 11A and 11B, the first chassis coupling member 212a of the first chassis side wall 202e may be coupled to the second chassis coupling member 214a included on the second chassis side wall 204e after the leveling subsystem 800 has aligned the first chassis base portion 202 and the second chassis base portion 204 to substantially maintain coplanarity. In an embodiment, the fixture member 802 of the leveling subsystem 800 may include a plurality of access apertures 806 that are configured to provide access to the first chassis coupling member 212a and the second chassis coupling member 214a when the fixture member 802 is coupled to the first chassis base portion 202 and the second chassis base portion 204. For example, a fastener may be inserted into the aperture 302 of the first chassis coupling member 212a and the aperture 304 of the second chassis coupling member 214a when the apertures 302 and 304 are aligned in order to provide the coupling. The leveling subsystem 800 substantially maintains the coplanarity of the first chassis base portion 202 and the second chassis base portion 204 during the coupling of the first chassis base portion 202 to the second chassis base portion 204 when assembling the split chassis system 201 such that, when the leveling subsystem 800 is removed from the first chassis base portion 202 and the second chassis base portion 204, the first chassis base portion 202 and the second chassis base portion 204 maintain substantial coplanarity due to those couplings.

Thus, systems and methods have been described that provide for the assembly of a split chassis system. Using the systems and methods of the present disclosure, a first chassis base portion and a second chassis base portion of the split chassis system may substantially maintain coplanarity when coupled together to form the split chassis system. A leveling subsystem may be included on the split chassis system such that the leveling subsystem aligns the first chassis base portion and the second chassis base portion to be substantially coplanar with each other. Thus, the leveling subsystems are configured to maintain a tolerance of coplanarity that is necessary for an assembled split chassis system to be inserted in a rack chassis envelope. Furthermore, the split chassis system provides allows system design and supply chain flexibility in enabling different combinations of front and rear types of information handling subsystems.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A split chassis system, comprising:
a first chassis base portion that includes a first chassis coupling member;
a second chassis base portion that includes a second chassis coupling member that is configured to be secured to the first chassis coupling member; and
a leveling subsystem provided on each of the first chassis base portion and the second chassis base portion, wherein the leveling subsystem is configured to align the first chassis base portion and the second chassis base portion such that a coplanarity of the first chassis base portion and the second chassis base portion is maintained within a chassis base housing tolerance when the first chassis coupling member is secured to the second chassis coupling member.

2. The split chassis system of claim 1, wherein the first chassis coupling member includes:
a pair of first chassis coupling member apertures that are spaced apart from each other, and wherein the second chassis coupling member includes:
a pair of second chassis coupling member apertures that are spaced apart from each other and configured to align with the pair of first chassis coupling member apertures.

3. The split chassis system of claim 2, wherein the second chassis coupling member is configured to be secured to the first chassis coupling member via respective fasteners positioned in the aligned pairs of first chassis coupling member apertures and second chassis coupling member apertures.

4. The split chassis system of claim 1, wherein the leveling subsystem includes:
a first chassis base portion stud that extends from the first chassis base portion adjacent the first chassis coupling member; and
a second chassis base portion channel that is defined by the second chassis base portion adjacent the second chassis coupling member and that is configured to receive the first chassis base portion stud to align the first chassis base portion and the second chassis base portion.

5. The split chassis system of claim 4, wherein the leveling subsystem includes:
a second chassis base portion stud that extends from the second chassis base portion adjacent the second chassis coupling member; and
a first chassis base portion channel that is defined by the first chassis base portion adjacent the first chassis coupling member and that is configured to receive the second chassis base portion stud to align the first chassis base portion and the second chassis base portion.

6. The split chassis system of claim 1, further comprising:
a first component located in the first chassis base portion; and
a second component located in the second chassis base portion.

7. The split chassis system of claim 1, wherein the coplanarity of the first chassis base portion and the second chassis base portion that is maintained within the chassis base housing tolerance includes a Z-axis angle variation of less than 1.5 degrees.

8. An information handling system (IHS), comprising:
a first computing component;
a second computing component that is coupled to the first computing component; and
a split computing chassis system, including:
a first chassis base portion that houses the first computing component and that includes a first chassis coupling member;
a second chassis base portion that houses the second computing component and that includes a second chassis coupling member that is secured to the first chassis coupling member; and
a leveling subsystem provided on each of the first chassis base portion and the second chassis base portion, wherein the leveling subsystem aligns the first chassis base portion and the second chassis base portion such that a coplanarity of the first chassis base portion and the second chassis base portion is maintained within a chassis base housing tolerance of a chassis housing defined by a rack.

9. The IHS of claim 8, wherein the first chassis coupling member includes:
a pair of first chassis coupling member apertures that are spaced apart from each other, and wherein the second chassis coupling member includes:
a pair of second chassis coupling member apertures that are spaced apart from each other and aligned with the pair of first chassis coupling member apertures.

10. The IHS of claim 9, wherein the second chassis coupling member is secured to the first chassis coupling member via respective fasteners positioned in the aligned pairs of first chassis coupling member apertures and second chassis coupling member apertures.

11. The IHS of claim 8, wherein the leveling subsystem includes:
a first chassis base portion stud that extends from the first chassis base portion adjacent the first chassis coupling member; and
a second chassis base portion channel that is defined by the second chassis base portion adjacent the second chassis coupling member, wherein the first chassis base portion stud is positioned in the second chassis base portion channel to align the first chassis base portion and the second chassis base portion.

12. The IHS of claim 11, wherein the leveling subsystem includes:
a second chassis base portion stud that extends from the second chassis base portion adjacent the second chassis coupling member; and
a first chassis base portion channel that is defined by the first chassis base portion adjacent the first chassis coupling member, wherein the second chassis base portion stud is positioned in the first chassis base portion channel to align the first chassis base portion and the second chassis base portion.

13. The IHS of claim 8, wherein the coplanarity of the first chassis base portion and the second chassis base portion that is maintained within the chassis base housing tolerance of the chassis housing defined by the rack includes a Z-axis angle variation of less than 1.5 degrees.

14. A method of maintaining coplanarity in a split chassis system, comprising:
positioning a first chassis base portion adjacent a second chassis base portion, wherein the first chassis base portion includes a first chassis coupling member, and wherein the second chassis base portion includes a second chassis coupling member that is located adjacent the first chassis coupling member when the first chassis base portion is positioned adjacent the second chassis base portion;

aligning, using a leveling subsystem provided on each of the first chassis base portion and the second chassis base portion while positioning the first chassis base portion adjacent the second chassis base portion, the first chassis base portion and the second chassis base portion such that a coplanarity of the first chassis base portion and the second chassis base portion is maintained within a chassis base housing tolerance; and securing the second chassis coupling member to the first chassis coupling member.

15. The method of claim 14, wherein the first chassis coupling member includes a pair of first chassis coupling member apertures that are spaced apart from each other, and wherein the second chassis coupling member includes a pair of second chassis coupling member apertures that are spaced apart from each other and that align with the pair of first chassis coupling member apertures when the first chassis base portion is positioned adjacent the second chassis base portion.

16. The method of claim 15, wherein the securing the second chassis coupling member to the first chassis coupling member includes:

positioning respective fasteners in the aligned pairs of first chassis coupling member apertures and second chassis coupling member apertures.

17. The method of claim 14, wherein the leveling subsystem includes a first chassis base portion stud that extends from the first chassis base portion adjacent the first chassis coupling member, and a second chassis base portion channel that is defined by the second chassis base portion adjacent the second chassis coupling member and that receives the first chassis base portion stud when the first chassis base portion is positioned adjacent the second chassis base portion to align the first chassis base portion and the second chassis base portion.

18. The method of claim 17, wherein the leveling subsystem includes a second chassis base portion stud that extends from the second chassis base portion adjacent the second chassis coupling member, and a first chassis base portion channel that is defined by the first chassis base portion adjacent the first chassis coupling member and that receives the second chassis base portion stud when the first chassis base portion is positioned adjacent the second chassis base portion to align the first chassis base portion and the second chassis base portion.

19. The method of claim 14, wherein a first component is located in the first chassis base portion, and a second component is located in the second chassis base portion.

20. The method of claim 14, wherein the coplanarity of the first chassis base portion and the second chassis base portion that is maintained within the chassis base housing tolerance includes a Z-axis angle variation of less than 1.5 degrees.

* * * * *